United States Patent
Tsao et al.

(10) Patent No.: US 12,202,015 B2
(45) Date of Patent: Jan. 21, 2025

(54) AIRBORNE CONTAMINANT MANAGEMENT METHOD AND SYSTEM

(71) Applicant: Taiwan Semiconductor Manufacturing Co., Ltd., Hsinchu (TW)

(72) Inventors: Chih-Ming Tsao, Hsinchu (TW); Tzu-Sou Chuang, Hsinchu (TW); Chwen Yu, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 669 days.

(21) Appl. No.: 17/477,453

(22) Filed: Sep. 16, 2021

(65) Prior Publication Data

US 2022/0297170 A1    Sep. 22, 2022

Related U.S. Application Data

(60) Provisional application No. 63/163,271, filed on Mar. 19, 2021.

(51) Int. Cl.
*B08B 15/00* (2006.01)
*B01D 46/44* (2006.01)
(Continued)

(52) U.S. Cl.
CPC ............ *B08B 15/00* (2013.01); *B01D 46/442* (2013.01); *G05B 15/02* (2013.01); *H01J 49/0036* (2013.01); *H01J 49/40* (2013.01); *H01L 21/67017* (2013.01); *B01D 2279/35* (2013.01); *G06V 10/751* (2022.01); *G06V 20/00* (2022.01);
(Continued)

(58) Field of Classification Search
CPC .................................................. H01L 21/67017
See application file for complete search history.

(56) References Cited

U.S. PATENT DOCUMENTS 5,960,638 A * 10/1999 McCabe ........... H01L 21/67017
165/47
6,053,687 A * 4/2000 Kirkpatrick ....... H01L 21/67173
414/222.13
(Continued)

FOREIGN PATENT DOCUMENTS

CN    103713096 A    4/2014
CN    104950037 A    9/2015
(Continued)

*Primary Examiner* — William A Harriston
(74) *Attorney, Agent, or Firm* — Seed IP Law Group

(57) ABSTRACT

A method includes: generating a contaminant distribution map by sampling an environment of a cleanroom; selecting a first fabrication tool of the cleanroom by comparing the contaminant distribution map with at least one diffusion image in a first database; comparing parameters of the first fabrication tool against process utility information in a second database; and when the parameters are consistent with the process utility information, taking at least one action. The one action may include moving a cleaning tool to a location associated with a contaminant concentration of the contaminant distribution map; turning on a fan of the cleaning tool; stopping pod transit to the first fabrication tool; or halting production by the first fabrication tool.

20 Claims, 16 Drawing Sheets

(51) Int. Cl.

| | | |
|---|---|---|
| *G05B 15/02* | (2006.01) | |
| *G06V 10/75* | (2022.01) | |
| *G06V 20/00* | (2022.01) | |
| *H01J 49/00* | (2006.01) | |
| *H01J 49/40* | (2006.01) | |
| *H01L 21/67* | (2006.01) | |
| *H01L 21/677* | (2006.01) | |

(52) U.S. Cl.
   CPC .. *H01L 21/67703* (2013.01); *H01L 21/67739* (2013.01)

(56) References Cited

U.S. PATENT DOCUMENTS

| | | | | |
|---|---|---|---|---|
| 6,176,120 | B1* | 1/2001 | You | G01N 1/2202 |
| | | | | 73/53.01 |
| 8,146,447 | B2* | 4/2012 | Lee | G03F 1/82 |
| | | | | 73/863.83 |
| 9,779,972 | B2* | 10/2017 | Favre | H01L 21/67253 |
| 10,606,289 | B2* | 3/2020 | Nair | G05D 23/1917 |
| 10,823,644 | B2 | 11/2020 | Chou et al. | |
| 11,493,909 | B1* | 11/2022 | Chen | G01N 21/9501 |
| 2002/0094684 | A1* | 7/2002 | Hirasaki | H01L 21/02052 |
| | | | | 257/E21.228 |
| 2003/0045131 | A1* | 3/2003 | Verbeke | H01L 21/67167 |
| | | | | 438/795 |
| 2005/0145012 | A1* | 7/2005 | Im | G01M 3/223 |
| | | | | 73/31.03 |
| 2006/0177922 | A1* | 8/2006 | Shamah | B01L 9/523 |
| | | | | 435/286.2 |
| 2007/0089540 | A1* | 4/2007 | Brazis | H01L 22/14 |
| | | | | 73/863 |
| 2007/0093071 | A1* | 4/2007 | Verhaverbeke | H01L 21/67173 |
| | | | | 430/269 |
| 2009/0112520 | A1* | 4/2009 | Lymberopoulos | G06F 11/24 |
| | | | | 702/184 |
| 2012/0259449 | A1* | 10/2012 | Favre | H01L 21/67253 |
| | | | | 700/121 |
| 2014/0083474 | A1* | 3/2014 | Chen | B08B 15/023 |
| | | | | 134/57 R |
| 2015/0056909 | A1* | 2/2015 | Chien | F24F 11/30 |
| | | | | 454/187 |
| 2016/0123938 | A1* | 5/2016 | Ly | G01N 1/26 |
| | | | | 702/26 |
| 2018/0046086 | A1* | 2/2018 | Waller | H01L 21/02087 |
| 2020/0018737 | A1* | 1/2020 | Yang | F24F 3/167 |
| 2020/0083074 | A1* | 3/2020 | Clark | H01L 21/0228 |
| 2023/0197505 | A1* | 6/2023 | Lutker-Lee | G03F 7/11 |
| | | | | 438/637 |

FOREIGN PATENT DOCUMENTS

| | | |
|---|---|---|
| CN | 108826488 A | 11/2018 |
| EP | 3025139 B1 | 4/2020 |
| TW | 202022777 A | 6/2020 |

* cited by examiner

Table 250BT:

| Image | Prob$_{222A1}$ | Prob$_{222A2}$ | Prob$_{222A3}$ | Prob$_{222A4}$ | Prob$_{222A5}$ | Prob$_{222A6}$ |
|---|---|---|---|---|---|---|
| 210A | 95% | 35% | 25% | 75% | 65% | 20% |
| 210B | 75% | 95% | 35% | 65% | 45% | 25% |
| 210C | 20% | 35% | 97% | 25% | 45% | 65% |
| 210D | 65% | 45% | 25% | 96% | 75% | 35% |
| 210E | 45% | 65% | 35% | 55% | 96% | 25% |
| 210F | 20% | 25% | 30% | 45% | 60% | 98% |

Table 210T:

| Region | Image |
|---|---|
| 230A1 | 210A |
| 230B7 | 210D |
| 230C7 | 210E |
| 230D3 | 210B |
| 230E3 | 210C |
| 230E7 | 210F |

FIG. 2E

AIRBORNE CONTAMINANT MANAGEMENT METHOD AND SYSTEM

PRIORITY CLAIM AND CROSS-REFERENCE

This application claims the benefit of priority to U.S. Provisional Application Ser. No. 63/163,271, entitled "CLEANROOM ENVIRONMENT ENHANCEMENT APPARATUS AND METHOD," filed on Mar. 19, 2021, which application is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Cleanrooms in which ICs are manufactured face increasingly stringent tolerances for particulates and contaminants, such as chemicals which may leak from fabrication tools or accessories attached to the fabrication tools. A cleanroom with relatively low particulate and/or contaminant levels may be associated with higher yield when fabricating smaller and more complex circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2H are views of a contaminant management process according to various aspects of the present disclosure.

DETAILED DESCRIPTION

Figure 1A:
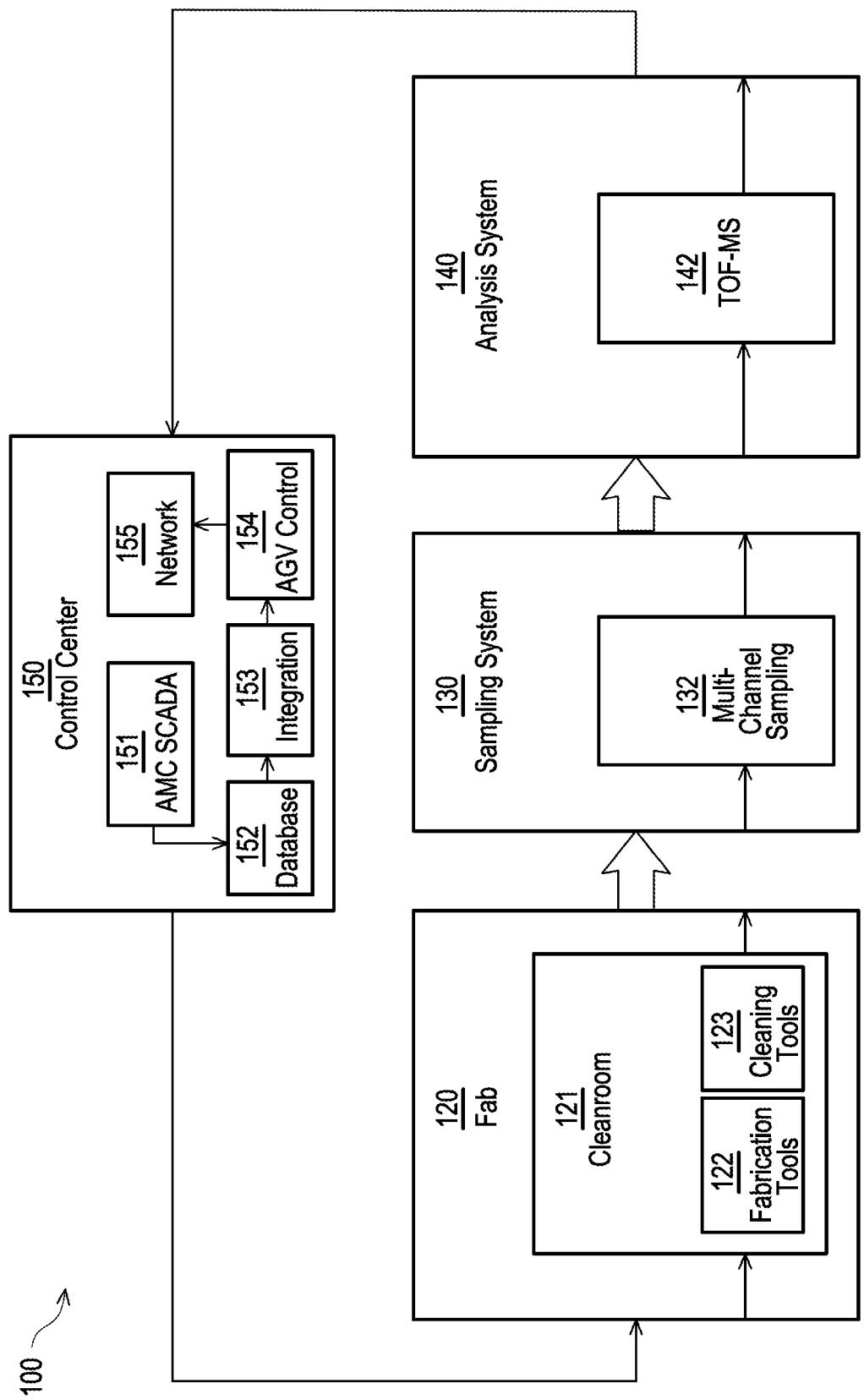
FIGS. 1A-1D are views of a contaminant management system according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "roughly," "substantially," and the like may be used herein for ease of description. A person having ordinary skill in the art will be able to understand and derive meanings for such terms. For example, "about" may indicate variation in a dimension of 20%, 10%, 5% or the like, but other values may be used when appropriate. A large feature, such as the longest dimension of a semiconductor fin may have variation less than 5%, whereas a very small feature, such as thickness of an interfacial layer may have variation of as much as 50%, and both types of variation may be represented by the term "about." "Substantially" is generally more stringent than "about," such that variation of 10%, 5% or less may be appropriate, without limit thereto. A feature that is "substantially planar" may have variation from a straight line that is within 10% or less. A material with a "substantially constant concentration" may have variation of concentration along one or more dimensions that is within 5% or less. Again, a person having ordinary skill in the art will be able to understand and derive appropriate meanings for such terms based on knowledge of the industry, current fabrication techniques, and the like.

Semiconductor fabrication generally involves the formation of electronic circuits by performing multiple depositions, etchings, annealings, and/or implantations of material layers, whereby a stack structure including many semiconductor devices and interconnects between is formed. Dimension scaling (down) is one technique employed to fit ever greater numbers of semiconductor devices in the same area. However, dimension scaling is increasingly difficult in advanced technology nodes. Cleanroom contaminant level tolerance is increasingly stringent to ensure sufficient yield as dimensions are scaled down.

Airborne molecular contamination (AMC) is overly represented in out-of-control (OOC) and out-of-specification (OOS) events. A variety of tools and methods are available for detecting increases in contaminant levels in the cleanroom, but are generally insufficient in many respects. A gas chromatography mass spectrometer (GC-MS) provides inline global monitoring of a large spectrum of contaminants, but is generally very slow, and may only be able to accommodate a single sampling point per processing zone. Patrolling operators may also carry or push around offline contaminant sampling devices, but these devices may only detect a small subset of the contaminants, such as acids, bases, and/or hydrochlorofluorocarbons (HCFCs), and are unable to detect total volatile organic compounds (TVOC). As such, detection and response to rises in AMC is generally accomplished with a significant delay, which increases likelihood of an OOC event becoming an OOS event, which can lead to stopping production while a tool or tool accessory causing the rise in AMC is identified, diagnosed, and repaired.

In embodiments of the present disclosure, time-of-flight mass spectrometry (TOF-MS) is employed, which measures various AMC parameters on a qualitative and/or quantitative basis, incorporating refrigerant byproducts (e.g., chlorofluorocarbons, hydrofluorocarbons, perfluorocarbons, or the like), isopropyl alcohol (IPA), acetone and general TVOC detection in minutes at hundredths of parts-per-billion (ppb) accuracy, and can reflect sudden leakage events with quick identification of chemical species.

Contaminant distribution and peak concentration level location may be calculated by computational fluid dynamics (CFD) techniques according to tool layout, and results recorded in a database. When AMC leakage occurs in the cleanroom, contaminants are collected by a sampler array and analyzed by the TOF-MS to generate an AMC concentration distribution map. Comparison between the AMC concentration distribution map and the calculated results may be used to predict a location (or tool) as the source of the leakage. The predicted location (or tool) may be further compared against tool information to ensure accurate prediction. The tool information may include signals indicating acid and/or solvent supply send from the tool, which may be stored in a factory-side SCADA via a system integration (SI) network. The tool information may further include tool running status from a fault detection system and/or tool utility information from an electronic bluebook ("e-Bluebook"). After comprehensive comparison and judgment, for example by artificial intelligence (AI)/machine learning (ML), the predicted AMC source can be identified and confirmed. If prediction results are inconsistent with the advanced comparison including the tool information just mentioned, the next most probable location/tool may be taken as the source of the leakage, and the same advanced comparison may be repeated until a match is found.

As such, quasi real-time detection and response can be achieved. The embodiments described may be deployed in sensitive process zones, such as etch, electrochemical plating (ECP)/seed deposition, bench or the like for local monitoring. In some embodiments, AMC real-time information is integrated into a centralized system, such as a supervisory control and data acquisition (SCADA) system, to generate contour maps and animations automatically, and issue alarms in AMC hot zones.

FIG. 1A is a schematic view of system 100 with AMC management, according to various embodiments of the disclosure. The system 100 may be configured to monitor contaminant levels in a cleanroom, dispatch automated cleaning units to a source of contaminant leakage, activate the automated cleaning units to lower the contaminant levels, halt transfer of front opening unified/universal pods (FOUPs) to a tool if it is the source, and stop production by the tool.

The system 100 includes a fab 120, a sampling system 130, an analysis system 140 and a control center 150, that interact with one another in manufacturing and/or services related to manufacturing an IC device. The entities in the system 100 are connected by a communications network. In some embodiments, the communications network is a single network. In some embodiments, the communications network is a variety of different networks, such as an intranet and the Internet. The communications network includes wired and/or wireless communication channels. In some embodiments, the communications network includes short range asset tracking hardware and software, such as radio-frequency identification (RFID), Bluetooth Low Energy (BLE), Wi-Fi, ultra-wideband (UWB), or the like. In some embodiments, the communications network includes wide range asset tracking hardware and software, such as low-power wide-area network (LPWAN), Long-Term Evolution (LTE), 5th generation mobile network (5G), Global Positioning System (GPS), or the like. Each entity interacts with one or more of the other entities and provides services to and/or receives services from one or more of the other entities. In some embodiments, one or more of the fab 120, the sampling system 130, the analysis system 140 and the control center 150 are owned by a single, larger company. In some embodiments, one or more of the fab 120, the sampling system 130, the analysis system 140 and the control center 150 coexist in a common facility and use common resources.

The fab 120 includes wafer fabrication tools 122 (hereinafter "fabrication tools 122") configured to execute various manufacturing operations on a semiconductor wafer such that the IC device is fabricated. In various embodiments, the fabrication tools 122 include one or more of a wafer stepper, an ion implanter, a photoresist coater, a process chamber, e.g., a chemical vapor deposition (CVD) chamber or low-pressure CVD (LPCVD) furnace, a chemical-mechanical planarization (CMP) system, a plasma etch system, a wafer cleaning system, or other manufacturing equipment capable of performing one or more suitable manufacturing processes as discussed herein.

The fabrication tools 122 are located in a cleanroom 121. The cleanroom 121 provides an environment designed to maintain an extremely low level of particulates, such as dust, airborne organisms, or vaporized particles, which may be quantified as number of particles per cubic meter. As IC feature sizes shrink, acceptable number and size of particulates decreases accordingly. Further, the cleanroom 121 may have limits on AMC, such as HCFCs, acids, bases, and other chemical species. As a result, the cleanroom 121 may include many design features for mitigating particulate and contaminant level increases, such as filtration units, specialized lighting, temperature and humidity controls, airlocks, pressure controls, and the like.

In addition to the above, the cleanroom 121 further includes cleaning tools 123. The cleaning tools 123 are configured to move to a location in the cleanroom 121, filter air locally by an onboard pump/fan and filter(s) to lower contaminant levels, and return to an electrical charging station without human intervention. In some embodiments, the cleaning tools 123 are automated guided vehicles (AGVs). The cleaning tools 123 are described in greater detail with reference to FIG. 1D. The cleanroom 121 is described in greater detail with reference to FIG. 1B.

The sampling system 130 collects samples of air from the cleanroom 121 at a large number of locations distributed throughout the cleanroom 121. The sampling system 130 may include a multi-channel sampling system 132, which collects the samples and is in fluidic communication with a TOF-MS 142 of an analysis system 140. In some embodiments, the multi-channel sampling system 132 includes a multi-channel sampler, a manifold piping sampler, a rotary valve sampler, or the like. The multi-channel sampling system 132 is described in greater detail with reference to FIG. 1C.

The analysis system 140 receives the samples of air from the sampling system 130 at the TOF-MS 142. The TOF-MS 142 may perform qualitative and/or quantitative analysis of chemicals in the samples. In some embodiments, the TOF- MS 142 measures mass and content level of molecular ions in the air of the cleanroom 121. For example, the TOF-MS 142 may detect concentration levels of refrigerant byproducts, IPA, acetone and/or general TVOCs in the samples at an accuracy of better than about 0.05 ppb, such as about 0.02 ppb. Processing of the detection by the TOF-MS 142 may be faster than about 2 minutes/sample, such as about 1 minute/sample, though other slower or faster detection processing times are also included, for example, due to relative simplicity (faster) or complexity (slower) of detecting various chemical concentrations.

The control center 150 receives and stores data from the TOF-MS 142 in a database 152. An AMC supervisory control and data acquisition (SCADA) 151 may receive measurements (e.g., concentration levels) from the TOF-MS 142, and write the measurements to the database 152. In some embodiments, the AMC SCADA 151 receives the measurements through a network to which the TOF-MS 142 and the AMC SCADA 151 are each connected. In some embodiments, the AMC SCADA 151 is a control system including at least one computer. The AMC SCADA 151 may store acid and/or solvent supply send information corresponding to each of the fabrication tools 122, for example, through a system integration network. In some embodiments, the AMC SCADA 151 may further control operation of the TOF-MS 142, including activation/deactivation (powering on/off) of the TOF-MS 142, order and/or type of measurements performed by the TOF-MS 142, and other suitable operation parameters of the TOF-MS 142. In some embodiments, the AMC SCADA 151 performs data processing on the measurements received from the TOF-MS 142, which may include writing the measurements to the database 152, as described above, and may also include other types of data processing, such as compression/decompression, noise reduction, smoothing, filtering, peak finding, and the like. In some embodiments, the AMC SCADA 151 performs visual graphic generation and display for the cleanroom 121 or one or more zones of the cleanroom 121.

The database 152 may be local, cloud-based, or any combination thereof. An integration system 153, which may be part of the AMC SCADA 151 in some embodiments, may read the measurements recorded in the database 152, and may generate contour maps corresponding to a layout of the cleanroom 121 (e.g., global map or zone maps) based on the measurements. An AGV controller 154 of the control center 150 may control the cleaning tools 123 remotely (e.g., through network equipment 155) to, for example, relocate to a contaminant hotspot, activate an onboard fan, deactivate the onboard fan, and return to a charging station. In some embodiments, the network equipment 155 includes at least one of wired and/or wireless communication channels, such as Wi-Fi, ultra-wideband (UWB), low-power wide-area network (LPWAN), Long-Term Evolution (LTE), 5th generation mobile network (5G), or the like. Details related to control of the cleaning tools 123 are described in greater depth with reference to FIGS. 2A-2D.

Figure 1B:
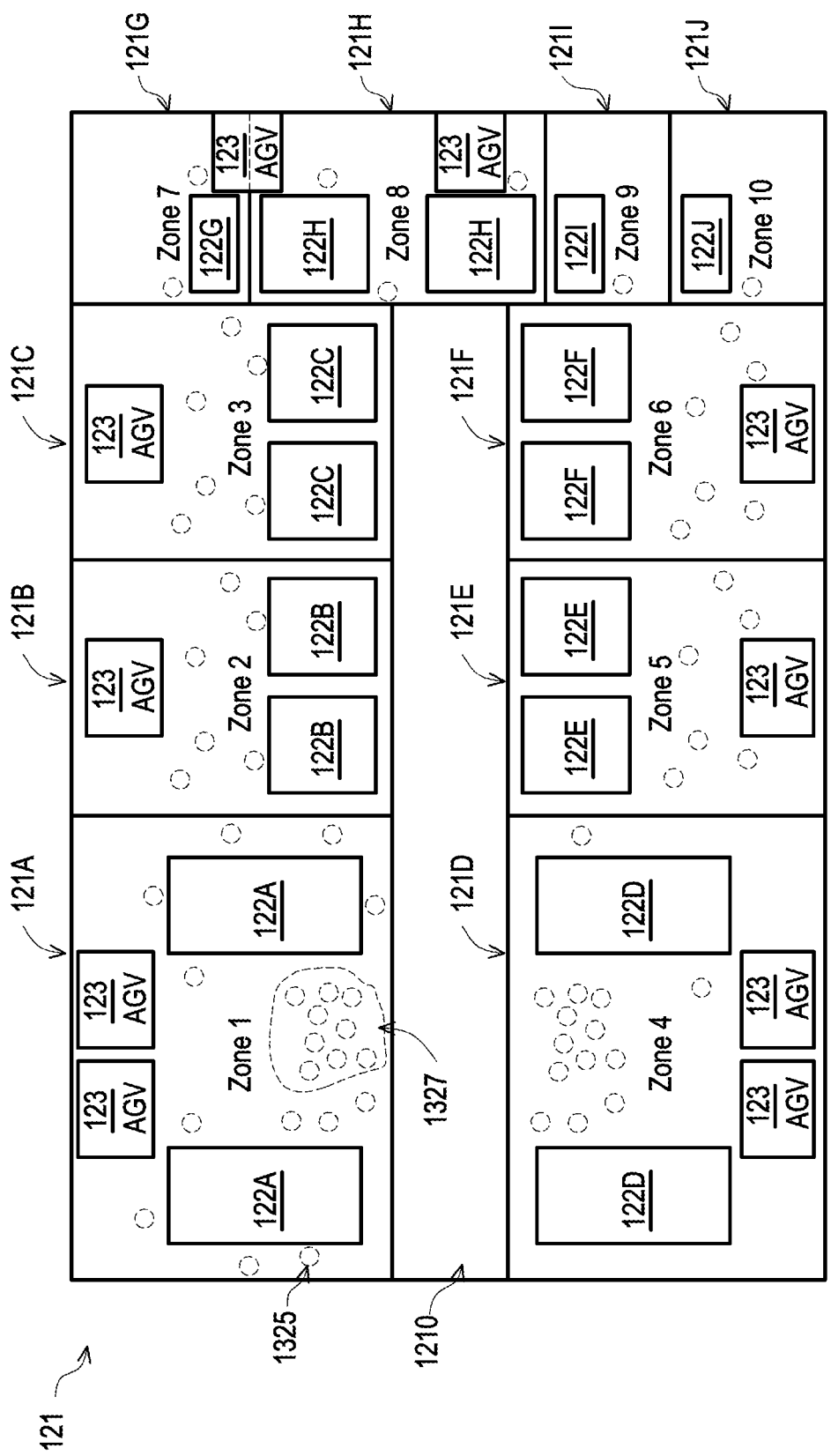

FIG. 1B is a diagram illustrating a partial floorplan of the cleanroom 121 in accordance with various embodiments. The fabrication tools 122 include various fabrication tools 122A-122J arranged in a number of zones 121A-121J, respectively. Ten zones 121A-121J are shown in FIG. 1B, however fewer or more zones may also be included in the cleanroom 121. The fabrication tools 122 may include any of deposition (e.g., CVD, PVD, ALD), plating (e.g., electroless copper plating), photolithography, etching, cleaning, and planarizing (e.g., CMP, grinding) tools, or other suitable tools for manufacturing the IC device. Each zone 121A-121J may include one or more type of tool, such as only etching tools, or a plating tool and a planarization tool. An aisle 1210 (or walkway) may extend between the zones 121A-121C and the zones 121D-121F, and may end abutting the zone 121H. Generally, the aisle 1210 is free of fabrication tools 122. Certain of the zones, such as the zones 121G, 121I, 121J, may not abut the aisle 1210. Cleaning tools 123, which may also be referred to as Automatic Guided Vehicle (AGVs), are located throughout the cleanroom 121 in the various zones 121A-121J. Some zones, such as the zone 121A, may have more than one cleaning tool 123, such as two cleaning tools 123. Certain other zones, such as the zones 121I, 121J may be free of the cleaning tools 123. Some zones, such as the zones 121G, 121H may share a cleaning tool 123.

Figure 1C:
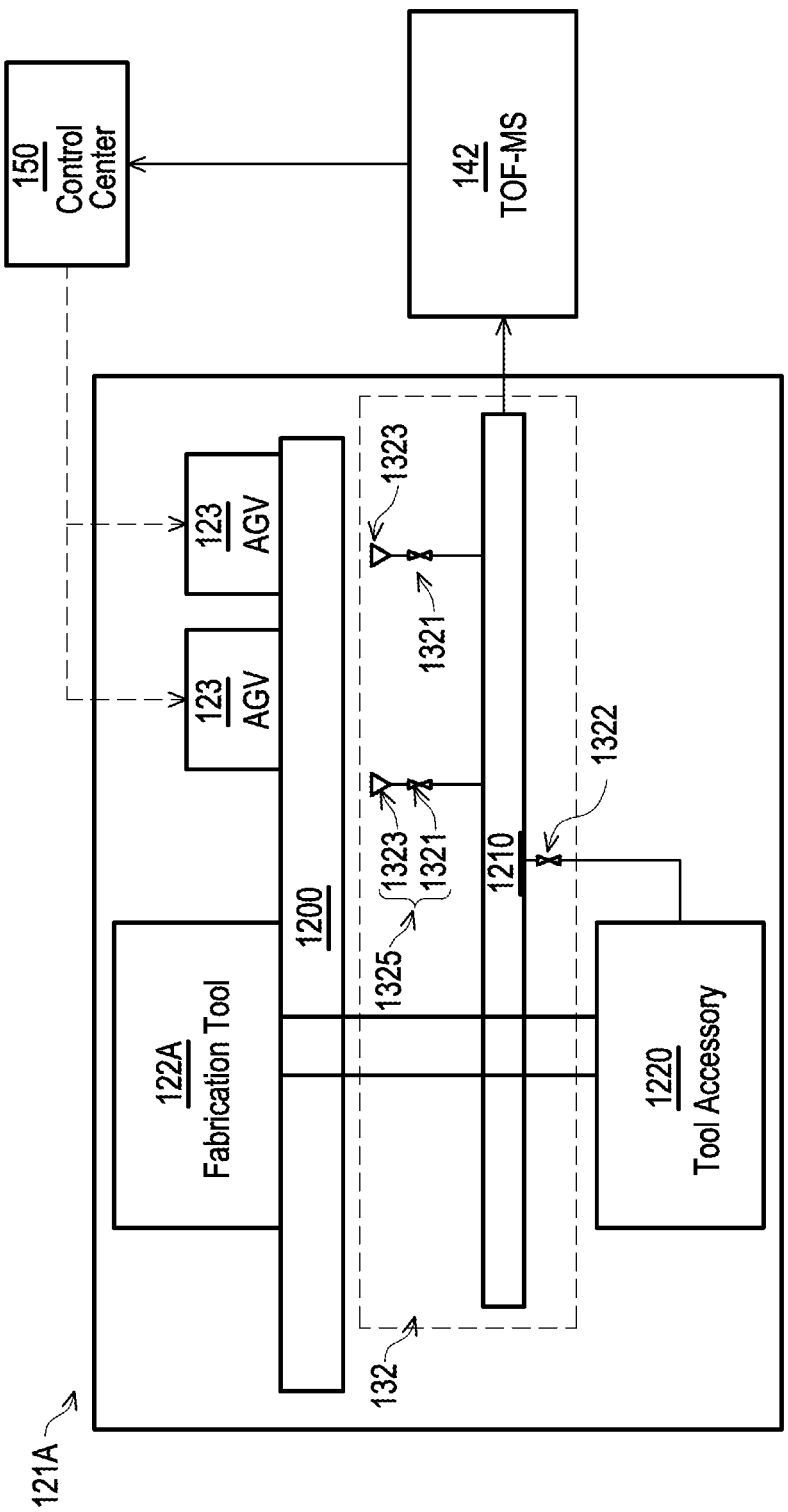

FIG. 1C is a diagram illustrating a partial side view of the zone 121A in accordance with various embodiments. The fabrication tools 121A and the cleaning tools 123 rest on a floor 1200, which may be a raised floor in some embodiments. A tool accessory 1220 in communication (e.g., fluidic, electric, data, or otherwise) with the fabrication tool 122A may be located beneath the floor 1200. In some embodiments, the tool accessory 1220 is a chest refrigerator/freezer, which may be used to cool components of and/or materials consumed by the fabrication tool 122A.

The multi-channel sampling system 132 is located beneath the floor 1200, in some embodiments. A sampling manifold 1210 is connected to a plurality of sampling ports 1321, 1322. The sampling port 1322 may be directly connected to a port (e.g., an exhaust port) of the tool accessory 1220. The sampling ports 1321 may be connected to air intakes 1323. Each set of one sampling port 1321 connected to an air intake 1323 may be collectively referred to as a sampling unit 1325. In some embodiments, a single sampling port 1321 may be connected to more than one air intake 1323.

In FIG. 1B, one or more sampling units 1325 may be located in each of the zones 121A-121J. Certain of the zones 121A-121J may include the sampling units 1325 at a higher density than others of the zones 121A-121J. For example, the zone 121A may include the sampling units 1325 at a higher density than the zone 121B. While each of the zones 121A-121J is illustrated having at least one of the sampling units 1325, certain of the zones 121A-121J may also be free of the sampling units 1325 in some other embodiments. The sampling units 1325 may be arranged in a uniform two-dimensional array, in some embodiments. As shown in FIG. 1B, arrangement of the sampling units 1325 may be aperiodic over the cleanroom 121 and/or within each of the zones 121A-121J. For example, the zone 121A may have higher density than the zones 121B-121J, and within the zone 121A, a high-density sampling region 1327 may include higher density than other regions within the zone 121A. The high-density sampling region 1327 may correspond to an area of the zone 121A that is more sensitive to contaminants, more prone to release of contaminants (e.g., a "hotspot"), or contains more dangerous contaminants (e.g., to yield, to safety, or the like). Density of the sampling units 1325 as a ratio of area of the cleanroom 121 may be measured in terms of number of the sampling units 1325 per one hundred square meters ($m^2$). In some embodiments, the density is in a range of about $1/m^2$ to about $50/m^2$, or about $10/m^2$ to about $30/m^2$. Below about $1/m^2$, sensitivity to contaminant leakage may be insufficient to identify the fabrication tool 122 or tool accessory 1220 that is leaking the contaminant.

Figure 1D:
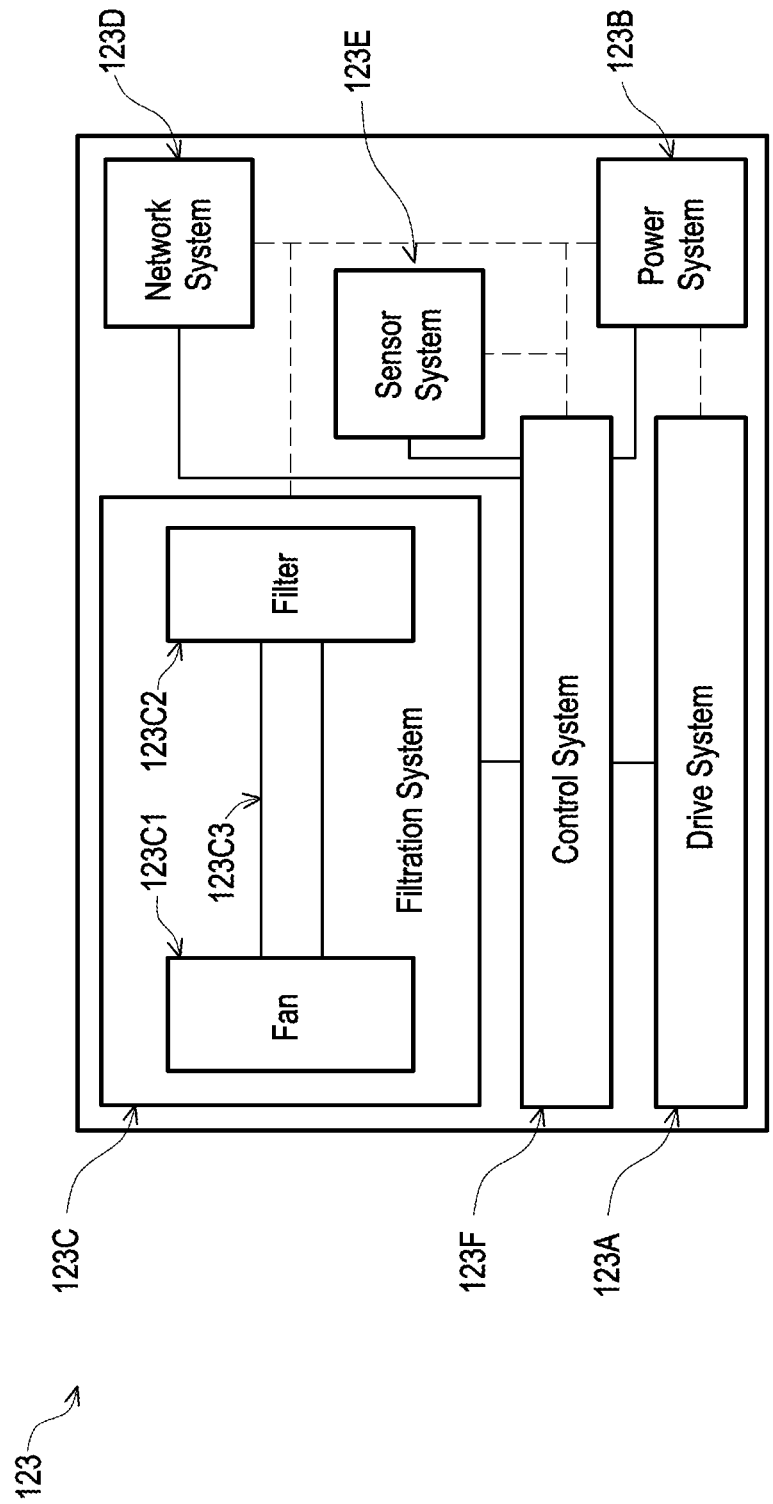

FIG. 1D is a schematic block diagram of the AGV 123 in accordance with various embodiments. A drive system 123A of the AGV 123 is configured to move the AGV 123 in at least two dimensions of space. The drive system 123A may include one or more motors, one or more wheels, and one or more axles. The drive system 123A receives power (e.g., electrical power) from a power system 123B. The drive system 123A further receives data, such as control signals for controlling motor rotation velocity, wheel/axle rotation angles and the like, from a control system 123F through a data connection, which may include one or more electrical and/or optical signal wires or one or more wireless network ICs.

A filtration system 123C of the AGV 123 is configured to remove contaminants from the air of the cleanroom 121. The filtration system 123C may include one or more filters 123C2, which may include chemical filters, high-efficiency particulate air (HEPA) filters, a combination thereof or the like. The filters 123C2 are in fluidic communication with one or more fans 123C1, which may be circular fans, blowers, exhaust fans or the like. In some embodiments, the fans 123C1 are in fluidic communication with the filters 123C2 through one or more ducts 123C3. In some embodiments, the fans 123C1 are in fluidic communication with the filters 123C2 through a housing of the filtration system 123C, and no additional duct 123C3 is present in the filtration system 123C. The power system 123B provides power to the filtration system 123C, for example, to drive rotation of the fans 123C1. In some embodiments, the filtration system 123C has an onboard power system (not separately illustrated), which may include at least a power monitoring/regulation IC. In such embodiments, the filtration system 123C may receive alternating current (AC) power from the power system 123B, and the onboard power system of the filtration system 123C may convert the AC power to direct current (DC) power for driving the fans 123C1. Such a configuration may provide improved modularity of the AGV 123, such that the filtration system 123C may be easily removed from the AGV 123, allowing the AGV 123 to be used for other purposes in the cleanroom 121.

The filtration system 123C of the AGV 123 and the control system 123F may be connected by a data connection. In some embodiments, the control system 123F of the AGV 123 may control parameters (e.g., power on/off, fan speed or the like) of the filtration system 123C by the data connection. In some embodiments, the filtration system 123C reports operation parameters, such as filter condition/age, to the control system 123F by the data connection.

A network system 123D of the AGV 123 is configured to transmit and/or receive data from an external network, such as via the network equipment 155 of the control center 150. In some embodiments, the network system 123D includes wireless network equipment, such as one or more ICs and one or more antennae capable of enabling data communication over a network using a protocol such as Wi-Fi, 4G/5G, or other suitable data communications protocol. The network system 123D is in data communication with the network equipment 155, in some embodiments. The network system 123D is also in data communication with the control system 123F, which may receive commands from the AGV controller 154 via the network system 123D. In some embodiments, the data communication between the network system 123D and the control system 123F is though one or more wires, such as electrical or optical wires, or through the air via two or more communication ICs (e.g., Bluetooth, NFC, or other similar ICs) located in the network system 123D and the control system 123F, respectively. Details of the commands and operation of the AGV 123 are described in greater depth with reference to FIG. 2A.

In some embodiments, the AGV 123 further includes a sensor system 123E having one or more sensors configured to provide information about the environment the AGV 123 operates in to at least the control system 123F. In some embodiments, the one or more sensors include at least one of an optical sensor (e.g., a camera, infrared sensor, or the like), a vibration sensor, an air quality sensor, or other suitable sensor. The sensors may enhance the ability of the AGV 123 to navigate, detect obstacles, or provide real-time, local information about the air quality in the direct vicinity of the AGV 123.

The control system 123F may include a microcontroller unit (MCU), a computer processing unit (CPU), a graphics processing unit (GPU), input/output (I/O) IC(s), buses, memory, data storage (e.g., a solid state drive, hard disc drive, etc.), and the like. The I/O IC(s) and buses are generally configured to allow one-way or two-way data communication between the control system 123F and the drive system 123A, the power system 123B, the filtration system 123C, the network system 123D and the sensor system 123E, which may be referred to collectively as "the systems 123A-123E." For example, the control system 123F may communicate with (e.g., transmit and/or receive data to/from) the systems 123A-123E by way of one or more universal serial bus (USB), peripheral component interconnect (PCI) and/or serial advanced technology attachment (SATA) bus. In some embodiments, the control system 123F communicates with the systems 123A-123E through an optical data bus, such as via fiber optics. Similar buses are present in the systems 123A-123E to enable the data communication with the control system 123F, in such embodiments.

Figure 2A:
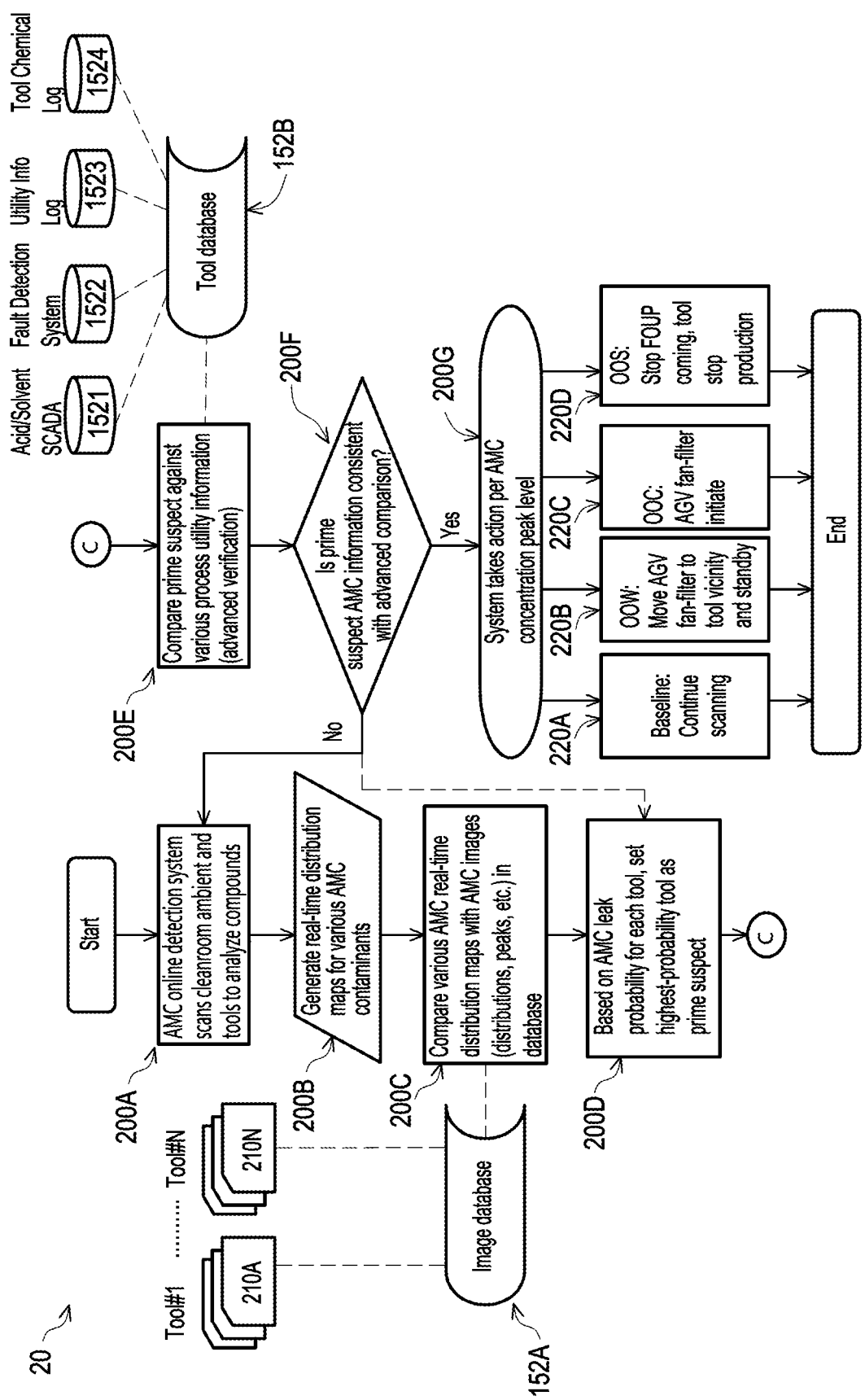

FIG. 2A is a diagram illustrating a process 20 for managing contaminants in the cleanroom 121 in accordance with various embodiments. The process 20 includes operations 200A-200G, 220A-200D, certain of which are illustrated in greater detail with reference to FIGS. 2B-2D. The process 20 will be further described according to one or more embodiments. It should be noted that the operations of the process 20 may be rearranged or otherwise modified within the scope of the various aspects. It should further be noted that additional processes may be provided before, during, and after the process 20, and that some other processes may be only briefly described herein.

In operation 200A, an AMC online detection system, which may be the system 100, scans the cleanroom 121, which may include scanning the ambient environment of the cleanroom 121 and scanning the fabrication tools 122. When scanning the ambient environment and/or the fabrication tools 122, the system 100 may scan for chemical compounds, which may include contaminants (e.g., TVOC) and/or process chemicals (e.g., acids, bases, solvents or the like).

In some embodiments, scanning the fabrication tools 122 includes determining the process chemicals associated with the fabrication tools 122. In some embodiments, the process chemicals are recorded in a database, such as the database 152. As shown in FIG. 2A, the database 152 may include one or more individual databases, such as an image database 152A and a tool database 152B. The tool database 152B may store information from one or more sources, such as a SCADA system 1521 (e.g., the AMC SCADA 151) that records acid and/or solvent used by the fabrication tools 122. The sources may further include a fault detection system 1522, a tool utility information log 1523 (e.g., an electronic bluebook), a tool chemical information record 1524, or the like.

In some embodiments, scanning the ambient environment includes one or more individual operations, such as sampling the ambient environment by the multi-channel sampling system 132 (as described with reference to FIG. 1C), and analyzing the samples obtained from the multi-channel sampling system 132 by the TOF-MS 142. An output of scanning the ambient environment may include levels of various elements (e.g., carbon, chlorine, fluorine, and the like) in parts per billion or another suitable measure.

The scanning of the ambient environment may be performed in a variety of different ways. In some embodiments, with reference to FIG. 1B, the multi-channel sampling system 132 may output samples from the sampling units 1325 in a particular order. For example, the sampling units 1325 may be ordered by zone 121A-121J, such that the multi-channel sampling system 132 outputs samples from all sampling units 1325 in a particular zone, such as the zone 121A, prior to outputting samples from a different zone, such as the zone 121B. In some embodiments, the multi-channel sampling system 132 may output the samples based on a prioritized list. For example, a first subset of the sampling units 1325 may be associated with a high occurrence of spikes in contaminant levels, a second subset of the sampling units 1325 may be associated with a moderate occurrence of spikes, and a third subset of the sampling units 1325 may be associated with a low occurrence of spikes. As such, samples may be taken from the sampling units 1325 in the first subset prior to the sampling units 1325 in the second subset, which may in turn be taken prior to samples from the sampling units 1325 in the third subset. In some embodiments, the prioritized list is generated based on historical sampling data collected over days, months, or years of sampling the sampling units 1325. In some embodiments, the prioritized list is generated using a machine learning algorithm, which may be similar to a process described in greater detail with reference to FIGS. 4A-4B. Once all sampling units 1325 have been sampled, the multi-channel sampling system 132 may start over.

In some embodiments, the multi-channel sampling system 132 outputs the samples from the sampling units 1325 in a random order or a pseudo-random order, and the random order or pseudo-random order may be combined with any of the above techniques. For example, the multi-channel sampling system 132 may randomly sample the sampling units 1325 in a certain zone (e.g., the zone 121A) until all of the sampling units 1325 in the zone have been sampled, then may move on to a different zone (e.g., the zone 121B) to sample the sampling units 1325 in that zone randomly until all of the sampling units 1325 in the different zone have been sampled. In some embodiments, the first subset of the sampling units 1325 may be sampled randomly, then the second subset may be sampled randomly, then the third subset may be sampled randomly.

In some embodiments, real-time contaminant distribution maps are generated for various AMC contaminants, corresponding to operation 200B of FIG. 2A. One distribution map may be generated for each AMC contaminant, and/or a single distribution map may be generated that includes concentration level information associated with multiple AMC contaminants. The distribution maps may be image files in which each pixel of the image file corresponds to a physical location (e.g., a region of a unit area) in the cleanroom 121, and has a color and/or brightness level corresponding to the measured level of one or more contaminants. Image files of the type just described may be referred to as heat maps. In some embodiments, the sampling units 1325 and/or the fabrication tools 122 are mapped by location onto the pixels of the image file. In some embodiments, a single sampling unit 1325 may correspond to one or multiple pixels, which may depend on resolution (width*length) of the image file. Similarly, the fabrication tools 122 may each correspond to many pixels. In some embodiments, each fabrication tool 122 is represented as one or more point sources in the image file. For example, the fabrication tool 122A may include one or more regions (oriented from a top view) that are more prone to leakage, such as input/output ports, exhaust ports, seals, or other similar regions. In such an example, the fabrication tool 122A may be represented in the image file as one or more distinct point sources corresponding to the regions more prone to leakage, each point source mapped to one or more pixels of the image file. Based on the color and/or brightness level at each mapped pixel, further interpolation may be performed at pixels not corresponding to any sampling unit 1325 or fabrication tool 122, such that each pixel in the image file may contain a magnitude (color and/or brightness level) corresponding either to a measured level or an interpolated level.

In operation 200C, one or more real-time contaminant distribution maps are compared with AMC images stored in a database, such as image database 152A. In some embodiments, the AMC images stored in the image database 152A include AMC diffusion images generated for different compounds at different concentrations and different times, such as by computation fluid dynamics (CFD) techniques. In some embodiments, CFD calculations are performed according to layout of the fabrication tools 122, and the CFD calculations are stored in the image database 152A. In some embodiments, when performing a CFD calculation for a certain fabrication tool 122, such as the fabrication tool 122A, an assumption is made that the fabrication tool 122A is a source of a contaminant leak, and a contaminant distribution and peak concentration level location are calculated by the CFD technique(s). As shown in FIG. 2A, for each fabrication tool 122, the image database 152A may store multiple contamination distribution images 210A-210N, which may correspond to the contaminant distributions calculated for the fabrication tools 122 using various conditions, such as the compound, concentration, time, and the like. The peak concentration level locations may be stored in the contamination distribution images 210A-210N, or may be stored as separate files, such as text files.

Figure 2B:
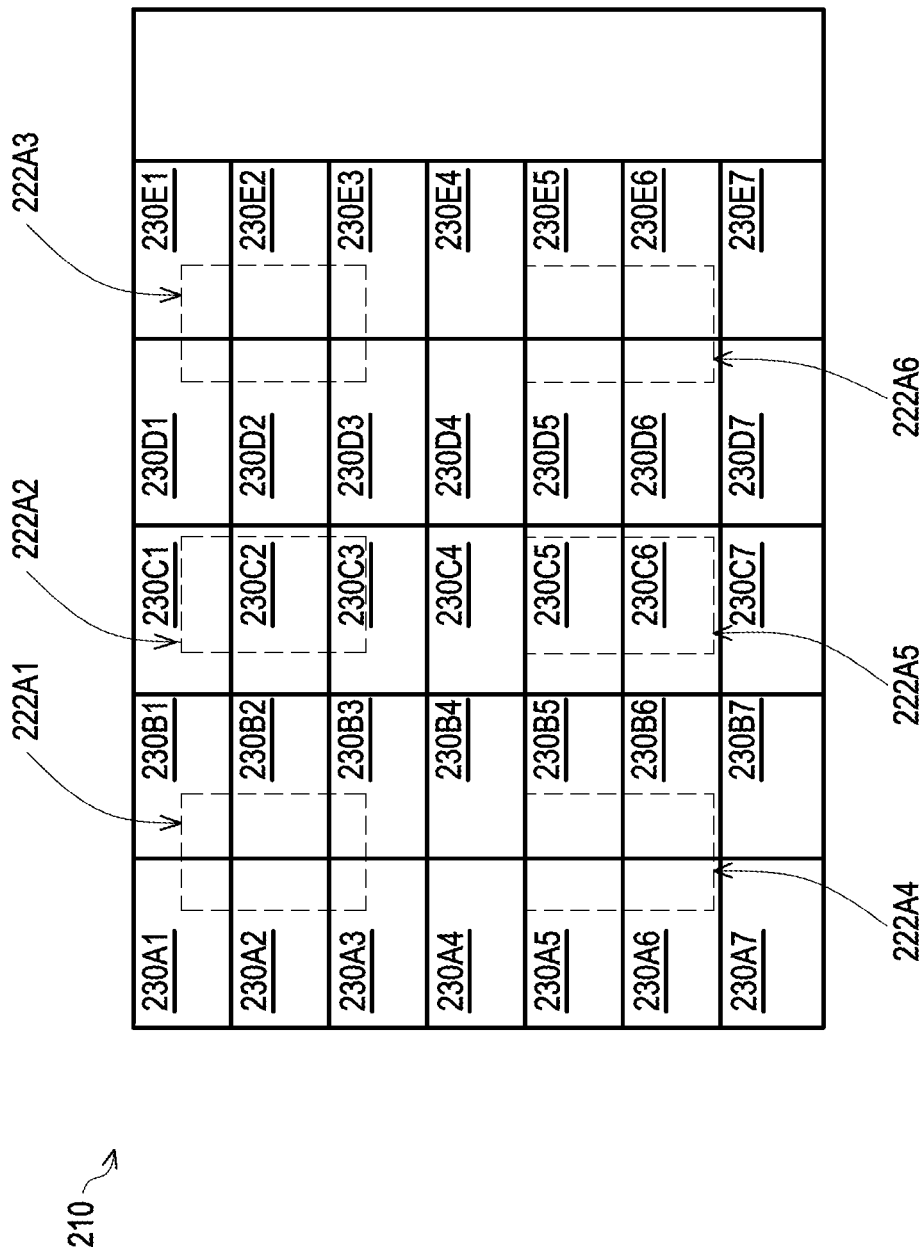

FIG. 2B illustrates a diffusion image 210 in accordance with various embodiments. The diffusion image 210 as shown includes seven rows and five columns, though more or fewer rows and/or columns may be included in various embodiments. Each column includes seven regions. For example, a first column includes regions 230A1-230A7, a second column includes regions 230B1-230B7, a third column includes regions 230C1-230C7, a fourth column includes regions 230D1-230D7 and a fifth column includes regions 230E1-230E7. Fabrication tools 222A1-222A6, which may be the fabrication tools 122, are mapped onto the diffusion image 210. In some embodiments, the fabrication tools 222A1-222A6 are not present as data in the diffusion image 210, which may be indicated by the dashed lines in FIG. 2B. Each of the fabrication tools 222A1-222A6 corresponds to one or more of the regions 230A1-230E7. For example, the fabrication tool 222A1 corresponds to six regions 230A1-230A3, 230B1-230B3, the fabrication tool 222A2 corresponds to three regions 230C1-230C3, the fabrication tool 222A3 corresponds to six regions 230D1-230D3, 230E1-230E3, the fabrication tool 222A4 corresponds to four regions 230A5, 230A6, 230B5, 230B6, the fabrication tool 222A5 corresponds to two regions 23005, 23006, and the fabrication tool 222A6 corresponds to four regions 230D5, 230D6, 230E5, 230E6. Each of the fabrication tools 222A1-222A6 may correspond to one region or more than six regions depending on size of each fabrication tool 222A1-222A6 and size of each region.

Figure 2C:
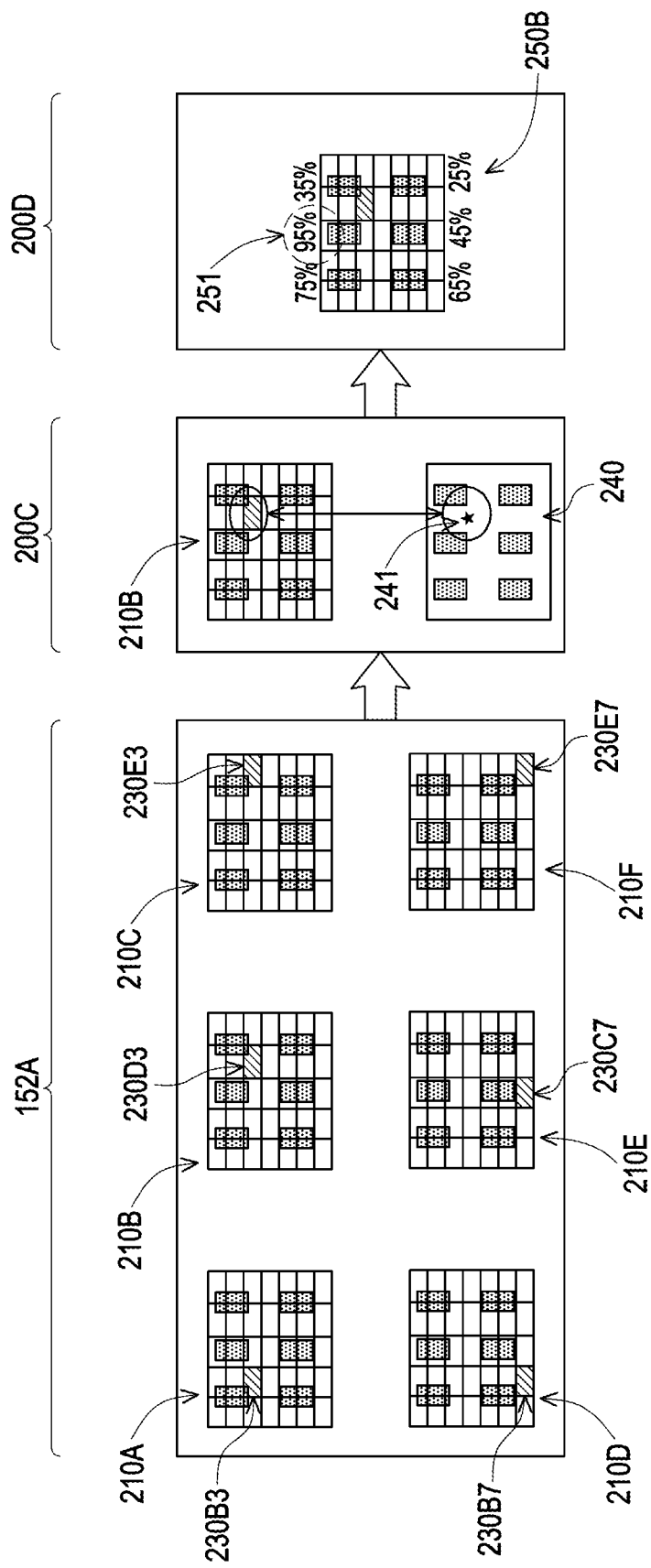

Contamination distribution images 210A-210F associated with the fabrication tools 222A1-222A6, respectively, are shown in FIG. 2C. Each contamination distribution image 210A-210F includes a peak concentration level (shown by hatching) in one of the regions 230A1-230E7. The peak concentration level may correspond to a peak concentration of the one or more compounds. For example, contamination distribution image 210A corresponding to fabrication tool 222A1 includes a peak concentration level at region 230B3, diffusion image 210B corresponding to fabrication tool 222A2 includes a peak concentration level at region 230D3, diffusion image 210C corresponding to fabrication tool 222A3 includes a peak concentration level at region 230E3, diffusion image 210D corresponding to fabrication tool 222A4 includes a peak concentration level at region 230B7, diffusion image 210E corresponding to fabrication tool 222A5 includes a peak concentration level at region 23007, and diffusion image 210F corresponding to fabrication tool 222A6 includes a peak concentration level at region 230E7.

Generally, a peak concentration level is present in only one region of each contamination distribution image 210A-210F. In some embodiments, each contamination distribution image 210A-210F may include a probability associated with each region 230A1-230E7. The probability may be a probability that a peak concentration level will occur in the particular region 230A1-230E7 assuming the conditions (compound, concentration, time) under which the fabrication tool 222A1-222A6 leaks contaminants. In such a configuration, the hatched regions in the contamination distribution images 210A-210F may represent region having the highest probability of a peak concentration level for the conditions. Further description of probabilities is provided with reference to operation 200D and FIG. 2C.

As described previously, one or more real-time contaminant distribution maps are compared with AMC images stored in a database, such as image database 152A, in operation 200C as shown in FIG. 2C. A distribution map 240 is shown, having a peak concentration level at a location 241 indicated by a star. The distribution map 240 may be determined as described with reference to FIGS. 1A-1D.

Figure 2D:
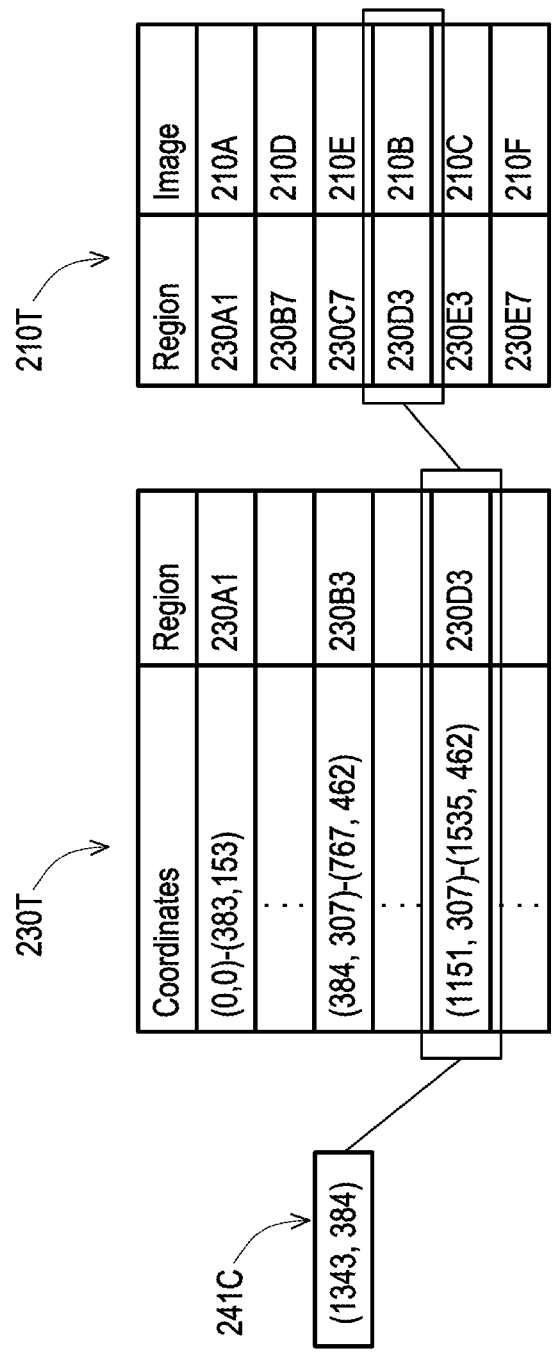

To determine which fabrication tool 222A1-222A6 is most probably the source of the peak concentration level at the location 241, with reference to FIG. 2D, the contamination distribution image 210A-210F most closely matching the distribution map 240 may be selected. In some embodiments, the selection is performed by determining the region 230A1-230E7 in which the location 241 is located. For example, in the distribution map 240, the location 241 may have coordinates 241C, such as "(1343, 384)". Using a region table 230T, the region 230A1-230E7 corresponding to the coordinates 241C may be determined, continuing the example, as the region 230D3 (see boxed row in the region table 230T). Determination of the contamination distribution image 210A-210F corresponding to the coordinates 241C may further be performed by looking up the region 230A1-230E7 corresponding to the location 241 (e.g., the region 230D3) in an image table 230T. Using the image table 230T, and again continuing the example, the diffusion image 210B may be selected from the image table 230T in the row corresponding to the region 230D3. As such, the diffusion image 210B may be selected as most closely matching the coordinates 241C of the location 241 exhibiting peak concentration level of the contaminant.

In operation 200D, referring again to FIG. 2A, having selected the contamination distribution image 210A-210F best matching the distribution map 240, a highest-probability fabrication tool 222A1-222A6 may be set as a prime suspect 251 (see FIGS. 2C, 2F) for causing the peak concentration level at the location 241 in the distribution map 240. In some embodiments, setting the prime suspect 251 may be based on AMC leak probability for each of the fabrication tools 222A1-222A6 with respect to the contamination distribution image 210A-210F best matching the distribution map 240. Continuing the example above, and with reference to FIG. 2C, a probability map 250B may be generated corresponding to the diffusion image 210B. In some embodiments, the probability map 250B may be or include a probability table 250T, as shown in FIG. 2E. In some embodiments, the percentages listed in the probability table 250T are forecasts/confidence scores generated by a machine learning/artificial intelligence process or inverse method, such as described with reference to FIGS. 4A-4B. In such embodiments, the percentages listed for each contamination distribution image 210A-210F may exceed 100% in total. Similarly, the percentage totaled across all contamination distribution images 210A-210F per fabrication tool 222A1-222A6 may exceed 100%. As shown in FIG. 2E, in operation 200D, the fabrication tool 222A2 has the highest percentage associated with the diffusion image 210B. As such, the fabrication tool 222A2 is set as the prime suspect 251 in operation 200D.

The above description of operations 200C, 200D with reference to FIGS. 2B-2E may correspond to simplified embodiments of the process 20, in which a single peak concentration level of a single contaminant is identified for the distribution map 240, and compared with the contamination distribution images 210A-210F to find the contamination distribution image 210A-210F best matching the peak concentration level in the distribution map 240. In some embodiments, a machine learning/artificial intelligence (ML/AI) process, such as described with reference to FIGS. 4A-4B, may be used to perform a more complex comparison that may incorporate a larger and more diverse set of inputs, including peak concentration levels and gradients/distributions of multiple contaminants and/or TVOC, information from the tool database 152B, and other suitable inputs. The ML/AI process may further be configured to identify at least two simultaneous and different contaminant leaks originating from two or more fabrication tools 222A1-222A6. Further description of the ML/AI process is provided with reference to FIGS. 4A-4B.

With reference to FIG. 2C, following identification and setting of the fabrication tool 222A2 as the prime suspect 251 in operation 200D, an advanced verification is performed in operation 200E. In some embodiments, the advanced verification includes comparing the prime suspect 251 (e.g., the fabrication tool 222A2) against various process utility information. In some embodiments, the process utility information is stored in a tool database 152B. The process utility information may include information from one or more sources 1521-1524.

As shown in FIG. 2C, a first source 1521 may include information about supply of one or more acid and/or solvents recorded by a SCADA, which may be a factory-side SCADA independent from the AMC SCADA 151. In some embodiments, the advanced verification is or includes determining whether the acid and/or solvent was being sent to the fabrication tool 222A2 when the distribution map 240 was generated. If the fabrication tool 222A2 was not supplied with acid/solvent during generation (a portion or all) of the distribution map 240, a first mismatch flag may be set indicating a mismatch between the fabrication tool 222A2 and the distribution map 240. If the acid/solvent was supplied during generation of the distribution map 240, a first match flag (or simply no flag) may be set, indicating a potential match between the fabrication tool 222A2 and the distribution map 240.

A second source 1522 may include information from a fault detection system. In some embodiments, the advanced verification is or includes comparing the fabrication tool 222A2 with information generated by the fault detection system. For example, the fault detection system may indicate operational status (e.g., active, stopped, under maintenance, under repair, or the like) of each of the fabrication tools 222A1-222A6. If the information in the tool database 152B from the second source 1522 indicates the fabrication tool 222A2 was not active (e.g., was stopped, under maintenance, under repair, or the like) for at least a portion (or all) of the time over which the distribution map 240 was generated, a second mismatch flag may be set indicating a mismatch between the fabrication tool 222A2 and the distribution map 240. If the fabrication tool 222A2 was active during a portion (or all) of the time over which the distribution map 240 was generated, as indicated by the tool database 152B, a second match flag (or simply no flag) may be set indicating a potential match between the fabrication tool 222A2 and the distribution map 240.

A third source 1523 may include information from a utility information log, which may be referred to as an electronic utility information (e.g., electronic bluebook, or "e-bluebook.") In some embodiments, the advanced verification is or includes comparing the contaminant(s) of the distribution map 240 with materials used by the fabrication tool 222A2 when the distribution map 240 was generated. If the contaminant(s) for which the fabrication tool 222A2 is the prime suspect 251 for leakage are not associated with the materials listed in the tool database 152B by the third source 1523, a third mismatch flag may be set indicating a mismatch between the materials used by the fabrication tool 222A2 and the contaminant(s) the fabrication tool 222A2 is suspected of leaking. If the contaminant(s) are associated with the materials listed in the tool database 152B, a third match flag (or simply no flag) may be set indicating a potential match between the materials used by the fabrication tool 222A2 and the contaminant(s) of the distribution map 240.

A fourth source 1524 may include information from a tool chemical log. In some embodiments, the advanced verification is or includes comparing chemicals used inside the fabrication tool 222A2 with the contaminant(s) detected when generating the distribution map 240. For example, the tool chemical log may record gas precursors used by certain of the fabrication tools 222A1-222A6, e.g., for a chemical vapor deposition (CVD) tool, an atomic layer deposition/etching (ALD/ALE) tool, or the like. If the information in the tool database 152B from the fourth source 1524 indicates chemicals not associated with the contaminant(s) detected when generating the distribution map 240, a fourth mismatch flag may be set indicating a mismatch between the fabrication tool 222A2 and the distribution map 240. If the fabrication tool 222A2 is indicated as using chemicals associated with the contaminant(s) detected when generating the distribution map 240, a fourth match flag (or simply no flag) may be set indicating a potential match between the fabrication tool 222A2 and the distribution map 240. The first to fourth mismatch flags may be referred to collectively as "the mismatch flags," and the first to fourth match flags may be referred to collectively as "the match flags."

Figure 2F:
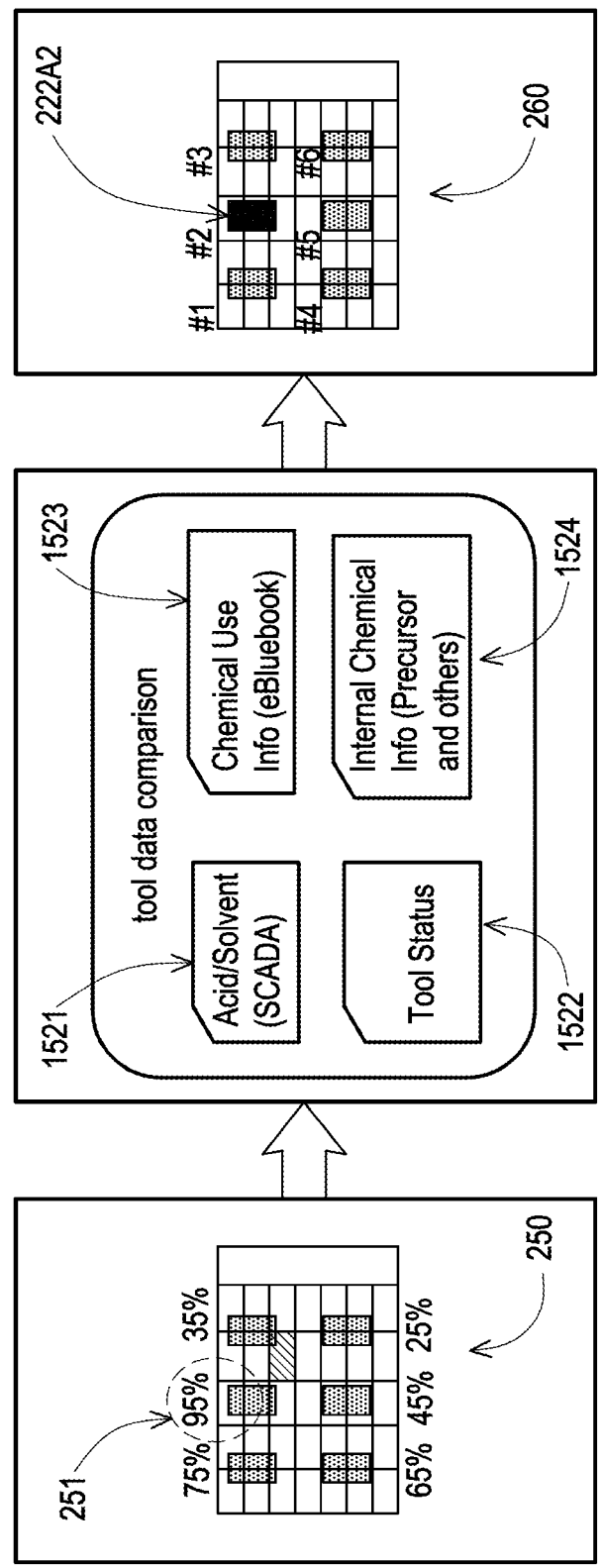

As shown in FIG. 2F, the prime suspect 251 may be compared with the four sources 1521-1524. If no mismatch flags are set following the comparison, the fabrication tool 222A2 may be confirmed as the source of the contaminant leakage, corresponding to the "Yes" branch of decision box 200F. If any of the mismatch flags is set in operation 200E, the process 20 may return to operation 200A corresponding to the "No" branch of the decision box 200F. Optionally, the process 20 may return to operation 200D, and the fabrication tool 222A1-222A6 having the second highest percentage in the probability table 250T may be selected. Continuing the previous example, if the fabrication tool 222A2 selected initially in operation 200D is found to have not been supplied with acid/solvent (first mismatch flag set), been inactive (second mismatch flag set), used materials inconsistent with the detected contaminant(s) (third mismatch flag set) and/or used chemicals inconsistent with the detected contaminant(s) (fourth mismatch flag set), the fabrication tool 222A1 may be selected as the prime suspect 251 in a subsequent iteration of operation 200D following "No" branching from operation 200F, as the fabrication tool 222A1 has the second-highest percentage in the row associated with the diffusion image 210B.

Once the prime suspect 251 is confirmed in operation 200F, one or more actions 220A-220D may be taken to address the contaminant leakage, corresponding to operation 200G of FIG. 2A. In some embodiments, the actions 220A-220D are taken based on peak concentration level under control of an AGV controller 154 (see FIG. 1A). The actions 220A-220D may correspond to one or more thresholds. In the configuration shown in FIG. 2A, a first threshold corresponds to a first action 220A, a second threshold corresponds to a second action 220B, a third threshold corresponds to a third action 220C, and a fourth threshold corresponds to a fourth action 220D.

The first threshold may be a baseline threshold, in some embodiments. The baseline threshold may be a concentration level below which no action should be taken by the AGVs 123. In some embodiments, the baseline threshold is a fixed concentration level in a range of about 0.04 ppb to about 1 ppm, though other ranges may be suitable depending on, for example, process node or safety considerations. In some embodiments, the baseline threshold is dynamic, and may be adjusted according to one or more process parameters, such as ambient temperature, production loading (e.g., number of the fabrication tools 122 running simultaneously), process node (e.g., certain nodes have higher sensitivity to contaminants than other nodes), or other suitable process parameters. In some embodiments, the baseline threshold is set by the AMC SCADA 151. When the peak concentration level of the distribution map 240 is below the first threshold, scanning of the cleanroom 121 (e.g., updating/generating of the distribution map 240) continues. As long as the peak concentration level is below the first threshold, generally no AGV 123 is activated for targeted cleaning of the air, and the AGVs 123 are located at a charging station. The AGVs 123 may be activated periodically for inspection or other purposes during the first action 220A.

The second threshold may be a warning (e.g., "out of warning") threshold. In some embodiments, the second threshold is a concentration level substantially equal to the first threshold. When the peak concentration level of the distribution map 240 is above the second threshold, the second action 220B is taken. In some embodiments, the second action 220B includes transmitting one or more commands to one or more of the AGVs 123 from the network equipment 155 to the network system 123D of the AGV 123 by the AGV controller 154. The commands may be received by the control system 123F, and may include an activate (e.g., power on) command, and/or a dispatch command.

The dispatch command may include a location, which may be a code corresponding to a destination, such as a fabrication tool 122 or waypoint near the fabrication tool 122. In some embodiments, the control system 123F may include or have access to an internal database (internal to the AGV 123), and may look up routing instructions, coordinates, or other relevant information used for navigating to the fabrication tool 122 or waypoint. In some embodiments, the dispatch command itself includes relevant information, such as coordinates of the fabrication tool 122 or waypoint, or routing instructions thereto, such that the control system 123F may be free of navigation databases and/or algorithms. In some embodiments, location of the AGV 123 is tracked, and the AGV controller 154 may send continuous navigation commands to the AGV 123 to direct motion of the AGV 123 toward an intended destination (e.g., the fabrication tool 122 or waypoint).

In some embodiments, one or more waypoint stations are present in the cleanroom 121, such as in each zone 121A-121J of the cleanroom 121. A waypoint station may include a broadcast system for guiding the AGV 123 to the waypoint station. In some embodiments, the broadcast system includes an audio system, a visual system, an electronic system, or other suitable broadcast system. In some embodiments, the visual system may include an infrared transmitter. The AGV 123 may receive a code corresponding to the waypoint station, and may move automatically toward the waypoint station based on a signal from the broadcast system. For example, the AGV 123 may move toward the waypoint station by detecting an increasing strength of the signal, e.g. an infrared signal, and moving in a direction where the strength of the signal is stronger than previous.

In some embodiments, the waypoint station includes a visual marker, such as a QR code or other visual pattern, and the sensor system 123E (e.g., one or more cameras) of the AGV 123 may be used to detect the visual pattern and guide the AGV 123 toward the visual pattern. In some embodiments, the broadcast system and the visual marker may be used in conjunction to provide faster, more robust guidance of the AGV 123 toward the waypoint station.

Upon reaching the destination, the control system 123F may stop motion of the AGV 123 (e.g., by stopping the drive system 123A), and may further control the drive system 123A to rotate the AGV 123 to orient the fan 123C1 and the filter 123C2 to an appropriate direction for cleaning the air in the vicinity of the location of the AGV 123. In some embodiments, the appropriate direction is determined based on the distribution map 240, for example, by determining a contour/gradient of flow of the contaminant(s). Based on the contour/gradient of the flow, the control system 123F may orient the filter 123C2 in an upstream direction of the flow and the fan 123C1 in a downstream direction of the flow. Once the destination is reached, and optionally once orientation of the AGV 123 is set, without the fan 123C1 turned on, the AGV 123 may be considered to be in a standby mode. While in the second action 220B, the fan 123C1 is generally not turned on, as the peak concentration level has not reached the third threshold or the fourth threshold. The fan 123C1 may be turned on briefly in standby to verify functionality of the fan 123C1 in preparation for cleaning in the third action 220C if the peak concentration level increases to exceed the third threshold.

The third threshold may be a control (e.g., "out of control," or "OOC") threshold. In some embodiments, the control threshold is a fixed concentration level in a range of about 0.1 ppb to about 1 ppm, though other ranges may be suitable depending on, for example, process node or safety considerations. In some embodiments, the control threshold is dynamic, and may be adjusted according to one or more process parameters, such as ambient temperature, production loading (e.g., number of the fabrication tools 122 running simultaneously), process node (e.g., certain nodes have higher sensitivity to contaminants than other nodes), or other suitable process parameters. Generally, the third threshold is higher than the second threshold, whether fixed or dynamic. For example, the third threshold may be higher than the second threshold by a fixed amount, such as 10 ppb, 1 ppb, 0.2 ppb, or another suitable fixed amount. In some embodiments, the third threshold is higher than the second threshold by a percentage, such as about 100%, about 50%, about 20% or other suitable percentage.

When the peak concentration level of the distribution map 240 exceeds the third threshold, the third action 220C is taken. In some embodiments, the third action 220C includes activating (e.g., powering on) the fan 123C1. In some embodiments, the fan 123C1 is configured to rotate at one or more speeds (e.g., revolutions per minute, or "RPM"). In some embodiments, the speed of the fan 123C1 is set at the same time or shortly after activating the fan 123C1. In some embodiments, the speed of the fan 123C1 is dynamically varied based on the peak concentration level. In some embodiments, the speed of the fan 123C1 is set at a maximum level initially to lower the peak concentration level as quickly as possible. Upon falling below the third threshold, the speed of the fan 123C1 may be set at an intermediate level lower than the maximum level to maintain the peak concentration level under the third threshold. In some embodiments, the fan 123C1 may continue to run until the peak concentration level is lowered to the baseline threshold.

Figure 2G:
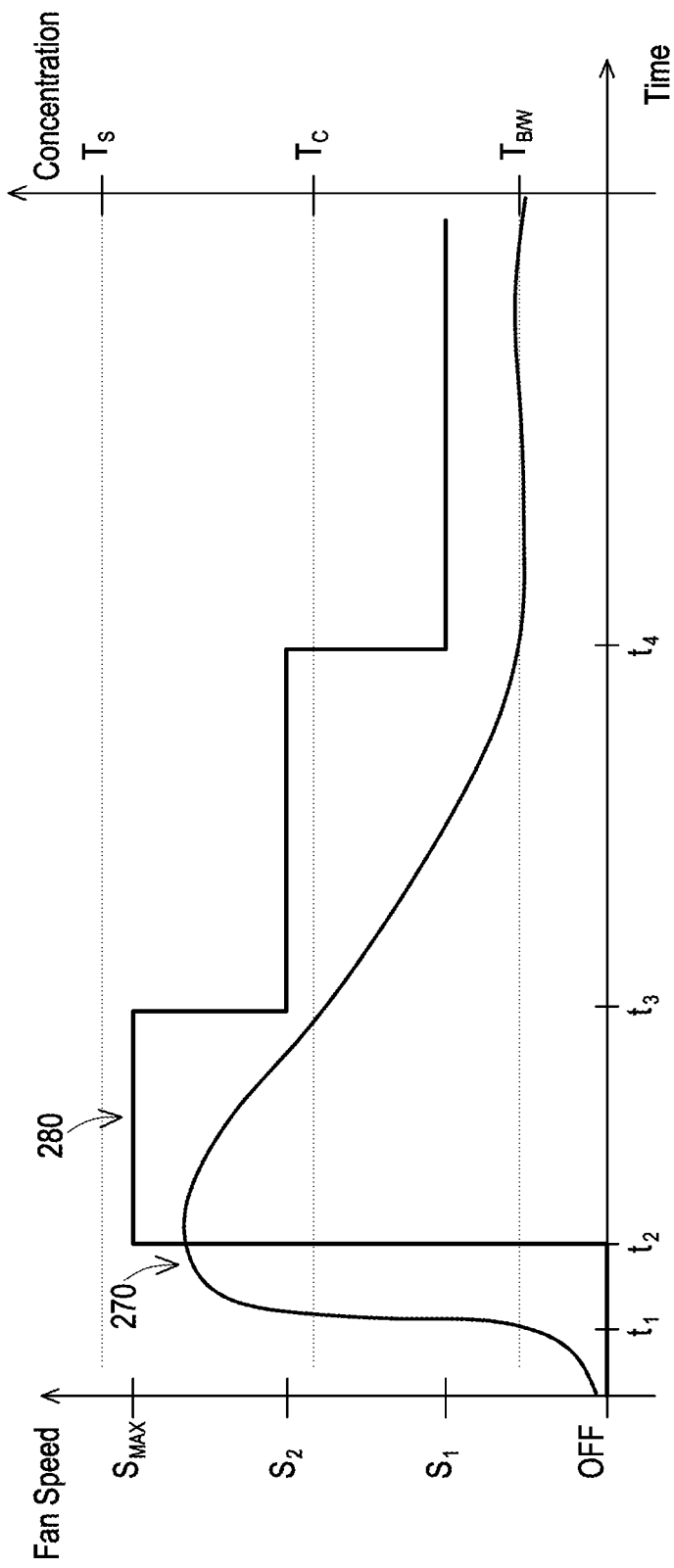

FIG. 2G illustrates the third action 220C in accordance with various embodiments. A curve 270 illustrates peak concentration level, and a curve 280 illustrates a fan speed waveform. Prior to a time $t_1$, the peak concentration level is below the first threshold and/or second threshold, which may be labeled collectively as $T_{B/W}$ in FIG. 2G. At time t1, the peak concentration level spikes to above the third threshold $T_C$, while remaining below the fourth threshold Ts. In this situation, upon exceeding the third threshold $T_C$, the AGV controller 154 may command one or more of the AGVs 123 to move to the fabrication tool 122 or waypoint, and turn on the fan 123C1 immediately upon arrival, or shortly before arrival. When the fan 123C1 turns on, the speed is set to a maximum speed $S_{MAX}$ at a time $t_2$. A delay may be present between the time $t_1$ when the AGV 123 is dispatched and the time $t_2$ when the AGV 123 arrives and the fan 123C1 is turned on, which is shown in FIG. 2G. In some embodiments, for a less dramatic spike, the AGV 123 may be standing by at the fabrication tool 122 or waypoint prior to the peak concentration level exceeding the third threshold $T_C$, such that a much shorter delay is present between the time $t_1$ and the time $t_2$, for example the time for detecting the peak concentration level plus the time from signal transmission from the AGV controller 154 to activation of the fan 123C1 by the control system 123F.

At time $t_3$, the peak concentration level drops below the third threshold $T_C$. In some embodiments, in response to the peak concentration level dropping below the third threshold $T_C$, the fan speed is lowered to an upper intermediate speed $S_2$, which is lower than the maximum speed $S_{MAX}$. Between the time $t_3$ and time $t_4$, the peak concentration level continues to drop, until reaching or going below the first threshold $T_{B/W}$. In some embodiments, in response to reaching or going below the first threshold $T_{B/W}$, the fan speed is lowered to a lower intermediate speed $S_2$, which is lower than the upper intermediate speed $S_1$. In some embodiments, the fan 123C1 may be turned off, such that the fan speed is substantially zero, e.g., 0 RPM. By maintaining the fan speed at the lower intermediate speed $S_2$, the peak concentration level may be controlled to less than, or substantially equal to, the first threshold $T_{B/W}$.

In the preceding description of FIG. 2G, the fan speed is illustrated using discreet speeds $S_1$, $S_2$, $S_{MAX}$. In some embodiments, the fan speed may be controlled finely, for example, as a gradient set by pulse width modulation (PWM), analog control, or another suitable technique. In such embodiments, the fan speed may track the peak concentration level, and establish a stable concentration level through, for example, a negative feedback control loop.

Figure 2H:
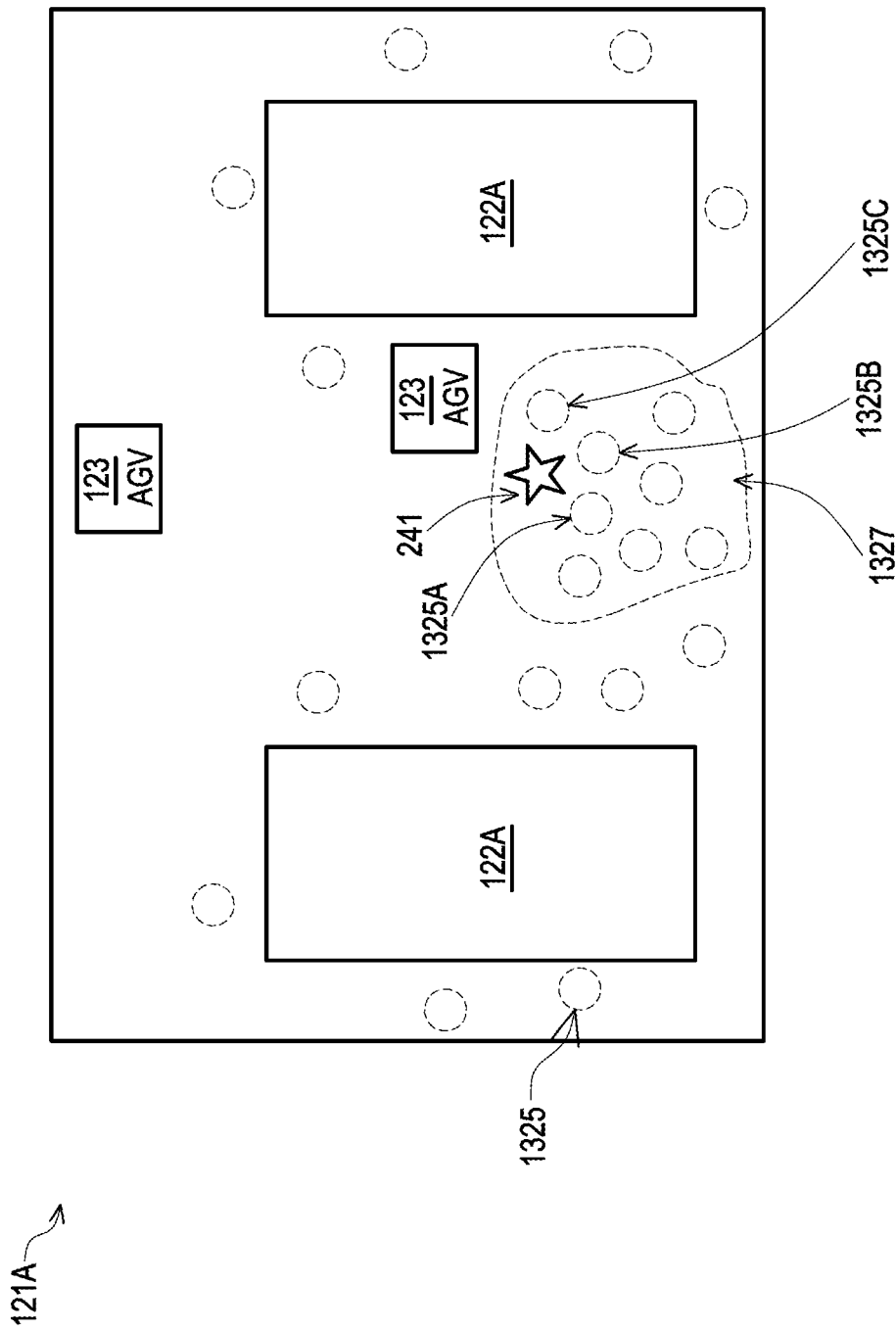

In some embodiments, with reference to FIG. 2H, during the third action 220C, measurement of the peak concentration level by the system 100 may be focused on a single sampling unit 1325 or group of sampling units 1325, such as in the high-density sampling region 1327, while temporarily excluding sampling through remaining sampling units 1325 of the system 100. For example, as shown in FIG. 2H, the location 241 of the peak concentration level may be near three sampling units 1325A-1325C. The location 241 is also located in the high-density sampling region 1327. By only sampling a single sampling unit 1325 (e.g., the sampling unit 1325B) or a small group of sampling units 1325 (e.g., the sampling units 1325A-1325C, or all sampling units 1325 in the high-density sampling region 1327), for example, in the vicinity of the location or fabrication tool 122 associated with the peak concentration level, the AGV controller 154 may respond more quickly to changes in the peak concentration level without having to wait for other sampling units 1325 distal the location 241 to be sampled, which may take as long as 1-2 minutes per sampling unit 1325. Such a focused sampling scheme may be advantageous for establishing the negative feedback loop described with reference to FIG. 2G.

In some embodiments, the third action 220C further includes activating an alarm or notification, which may be routed to manufacturing and/or factory operators. In response to the alarm or notification, which may indicate the fabrication tool 122 identified as source of the contaminant leak and the associated peak concentration level, the operator may perform an on-site verification of the leak, shut down the fabrication tool 122, perform maintenance and/or repair, schedule maintenance and/or repair, or take another suitable action that stops the contaminant leak and/or repairs the contaminant leak.

Referring again to FIG. 2A, the fourth threshold may be a specification (e.g., "out of specification," "OOS") threshold. The fourth threshold may be set to a level at which the fabrication tool 122 may be turned off to prevent safety and/or yield incidents. For example, TVOC or individual contaminant concentration may be toxic at certain concentration levels, or may affect yield at other concentration levels. The fourth threshold may be set to a level that is well below a toxic level or yield impairing level, e.g., less than 50%, less than 20%, less than 10% or less than 1% of the toxic level or yield impairing level.

Upon reaching and/or exceeding the fourth threshold, the fourth action 220D is taken. In some embodiments, the fourth action 220D includes taking measures to stop the leak causing the peak contaminant level above the fourth threshold. In some embodiments, the measures include one or more of stopping FOUP arrival at the fabrication tool 122, stopping production by the fabrication tool 122, or other suitable measures for stopping the leak. Stopping production may include putting the fabrication tool 122 in a standby/idle mode, such that the fabrication tool 122 remains powered on, but does not perform production processes on semiconductor wafers. Stopping production may include powering down the fabrication tool 122. Stopping production may be performed automatically by a SCADA, such as a factory-side SCADA. In some embodiments, the fourth action 220D includes generating an alarm and/or sending a notification to an operator identifying the fabrication tool 122 and the peak concentration level, and the operator manually stopping production by the fabrication tool 122.

Due to delay between sampling events at the same sampling unit 1325, the peak concentration level as measured may appear to spike rapidly from below the first threshold directly to above the fourth threshold, such that a first measurement of a nearby sampling unit 1325 to the location 241 is below the first threshold and the immediately subsequent second measurement of the nearby sampling unit 1325 is above the fourth threshold. As such, if the fourth threshold is exceeded prior to taking the first action 220B or the second action 220C, the AGV 123 may not have been dispatched to the location 241 prior to reaching the fourth threshold. In this situation, the AGV controller 154 may not dispatch the AGV 123 in response to the peak concentration level exceeding the fourth threshold, as production by the fabrication tool 122 is stopped in the fourth action 220D. Similarly, if the AGV 123 has been cleaning the air near the location 241 under the third action 220C, and the fourth threshold is exceeded, in the fourth action 220D, the AGV 123 may be recalled, for example, to a charging station.

Figure 3A:
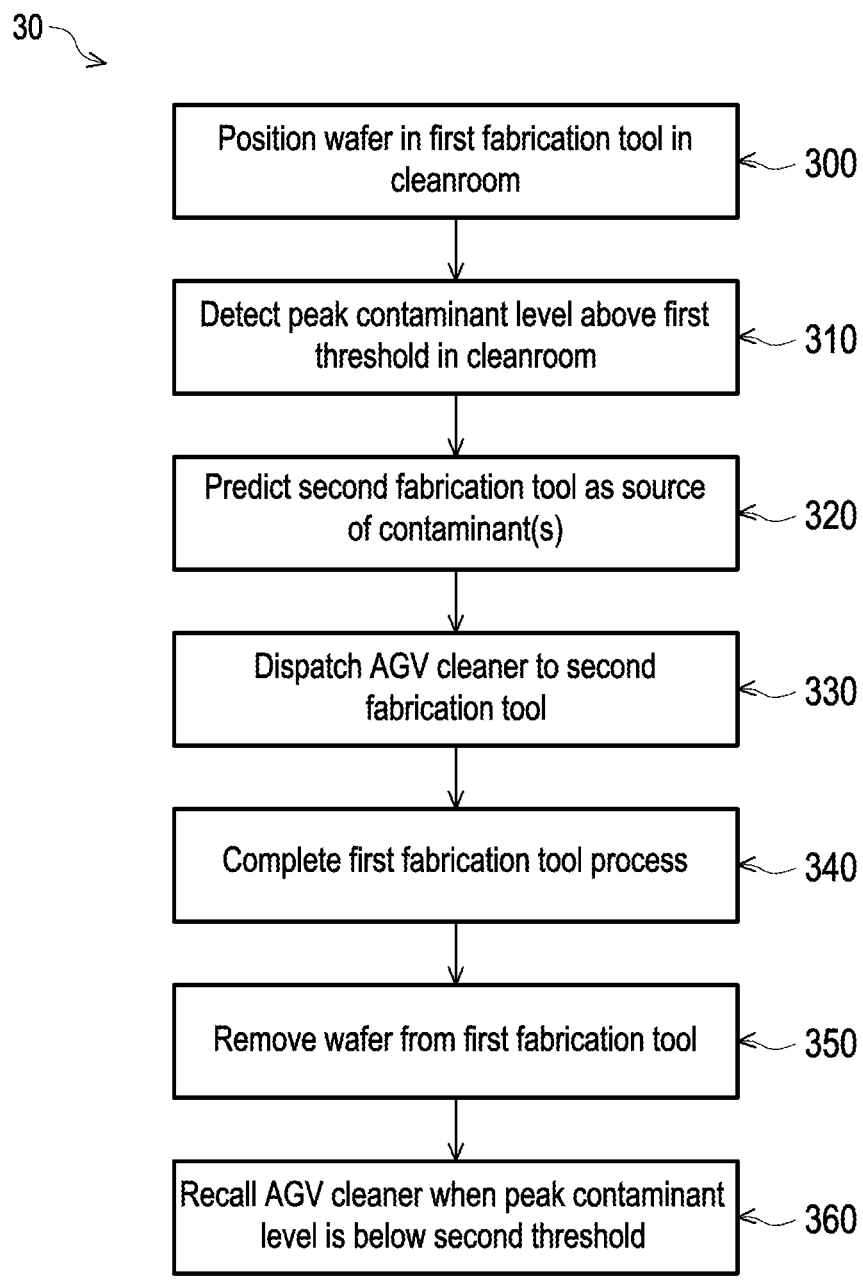
FIGS. 3A-3B are flowcharts illustrating methods of processing a wafer according to various aspects of the present disclosure.

FIG. 3A illustrates a flow chart associated with a process 30 for fabricating an IC device in accordance with various embodiments. The process 30 may be used in conjunction with the system 100 and the process 20 described with reference to FIGS. 1A-2H. The process 30 will be further described according to one or more embodiments. It should be noted that the operations of the process 30 may be rearranged or otherwise modified within the scope of the various aspects. It should further be noted that additional processes may be provided before, during, and after the process 30, and that some other processes may be only briefly described herein.

In operation 300, a wafer is positioned in a first fabrication tool (e.g., the fabrication tool 222A1, FIG. 2B) in a cleanroom (e.g., the cleanroom 121, FIGS. 1A, 1B). In some embodiments, positioning the wafer includes delivering the wafer in a FOUP to a port of the first fabrication tool. A door of the FOUP may open, and a robotic arm may pick up the wafer and transfer the wafer into a chamber of the first fabrication tool. The robotic arm, or a second robotic arm, may position the wafer on a wafer stage in the first fabrication tool for processing, such as deposition, etching, cleaning, annealing or the like.

In operation 310, a peak contaminant level may be detected that is above a first threshold in the cleanroom. In some embodiments, the peak contaminant level is detected by an AMC SCADA, such as the AMC SCADA 151, based on measurements by an analysis system, such as the analysis system 140 including the TOF-MS 142. In some embodiments, the peak contaminant level is the peak contaminant level of the distribution map 240 located at the location 241. The first threshold in operation 310 may correspond to the warning threshold or the control threshold described with reference to FIG. 2A.

In operation 320, a second fabrication tool (e.g., the fabrication tool 222B, FIG. 2B) is predicted as the source of contaminant(s) of the peak contaminant level. Prediction of the second fabrication tool may be performed using the operations 200A-200F of process 20 described with reference to FIGS. 2A-2H.

In operation 330, an AGV cleaner, such as the AGV 123, is dispatched to a location corresponding to the second fabrication tool. The dispatching may be performed as described for the second action 220B of FIG. 2A. In some embodiments, the AGV cleaner is dispatched by an AGV controller, such as the AGV controller 154 shown in FIG. 1A. In some embodiments, the AGV cleaner is dispatched to a position near the location 241 of the peak contaminant level. For example, the AGV cleaner may be dispatched to a position within less than 10 meters, within less than 5 meters or within less than 1 meter from the location 241, in some embodiments. As such, the position to which the AGV cleaner is dispatched may be determined independent of location of the second fabrication tool.

In operation 340, the first fabrication tool completes processing of the wafer. In some embodiments, the processing of the wafer by the first fabrication tool is performed while the AGV cleaner is cleaning the air near the location 241 of the peak contaminant level. In some embodiments, the peak contaminant level is reduced by action of the AGV cleaner through a portion or the entirety of the processing of the wafer by the first fabrication tool. In some embodiments, the AGV cleaner reduces the peak contaminant level to below the baseline threshold prior to completion of the processing of the wafer by the first fabrication tool.

In operation 350, the wafer is removed from the first fabrication tool after completion of the processing by the first fabrication tool. In some embodiments, the wafer is transferred from inside the first fabrication tool to a FOUP, which may be the same or different from the FOUP that delivered the wafer to the first fabrication tool, by a robotic arm.

In operation 360, the AGV cleaner may be recalled when the peak contaminant level drops below a second threshold, which may be the baseline threshold, in some embodiments. The peak contaminant level may drop below the second threshold due to cleaning by the AGV cleaner, due to stopping the second fabrication tool, or due to fixing the leak in the second fabrication tool, for example.

Figure 3B:
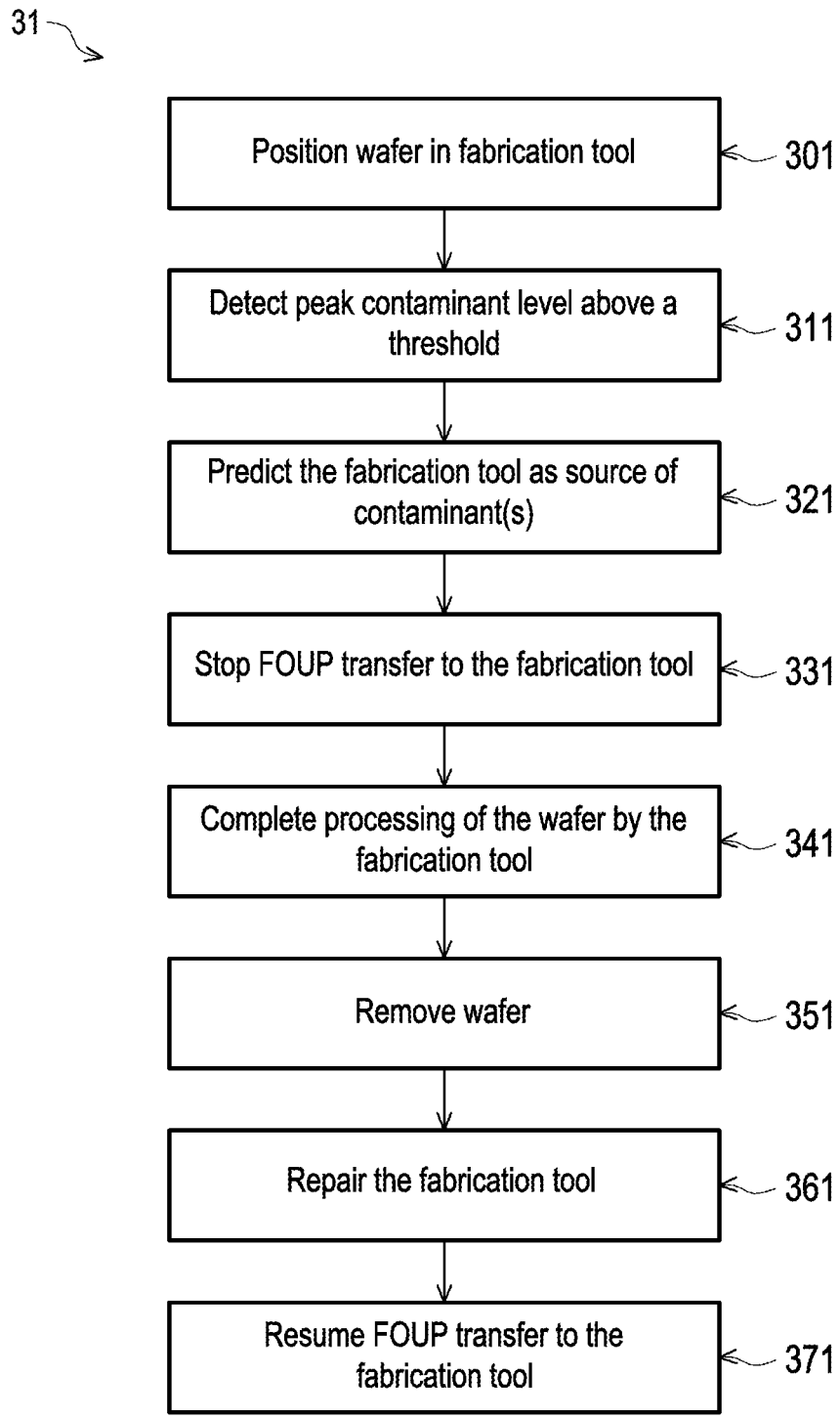

FIG. 3B illustrates a flow chart associated with a process 31 for fabricating an IC device in accordance with various embodiments. The process 31 may be used in conjunction with the system 100 and the process 20 described with reference to FIGS. 1A-2H. The process 31 will be further described according to one or more embodiments. It should be noted that the operations of the process 31 may be rearranged or otherwise modified within the scope of the various aspects. It should be noted further that additional processes may be provided before, during, and after the process 31, and that some other processes may be only briefly described herein.

In operation 301, a wafer is positioned in a fabrication tool (e.g., the fabrication tool 222A1, FIG. 2B) in a cleanroom (e.g., the cleanroom 121, FIGS. 1A, 1B). In some embodiments, positioning the wafer includes delivering the wafer in a FOUP to a port of the fabrication tool. A door of the FOUP may open, and a robotic arm may pick up the wafer and transfer the wafer into a chamber of the fabrication tool. The robotic arm, or a second robotic arm, may position the wafer on a wafer stage in the fabrication tool for processing, such as deposition, etching, cleaning, annealing or the like.

In operation 311, a peak contaminant level may be detected that is above a threshold in the cleanroom. In some embodiments, the peak contaminant level is detected by an AMC SCADA, such as the AMC SCADA 151, based on measurements by an analysis system, such as the analysis system 140 including the TOF-MS 142. In some embodiments, the peak contaminant level is the peak contaminant level of the distribution map 240 located at the location 241. The threshold in operation 311 may correspond to the specification threshold described with reference to FIG. 2A.

In operation 321, the fabrication tool is predicted as the source of contaminant(s) of the peak contaminant level. Prediction of the fabrication tool may be performed using the operations 200A-200F of process 20 described with reference to FIGS. 2A-2H.

In operation 331, FOUP transfer to the fabrication tool is stopped, which may correspond to the fourth action 220D of FIG. 2A. In some embodiments, the FOUP transfer is stopped by a SCADA system, such as a factory-side SCADA system different from the AMC SCADA 151.

In operation 341, the fabrication tool completes processing of the wafer. In some embodiments, the processing of the wafer by the fabrication tool is performed while the FOUP transfer is stopped in operation 331.

In operation 351, the wafer is removed from the fabrication tool after completion of the processing by the fabrication tool. In some embodiments, the wafer is transferred from inside the first fabrication tool to a FOUP, which may be a FOUP located at the fabrication tool prior to stopping the FOUP transfer in operation 331.

In operation 361, the fabrication tool is repaired. In some embodiments, the fabrication tool is repaired after all in process wafers located in the fabrication tool are finished processing. In some embodiments, in process wafers are removed from the fabrication tool prior to finishing processing, and temporarily stored (e.g., in a FOUP), until repair of the fabrication tool is complete.

In operation 371, FOUP transfer to the fabrication tool is resumed following repair of the fabrication tool.

Figure 4A:
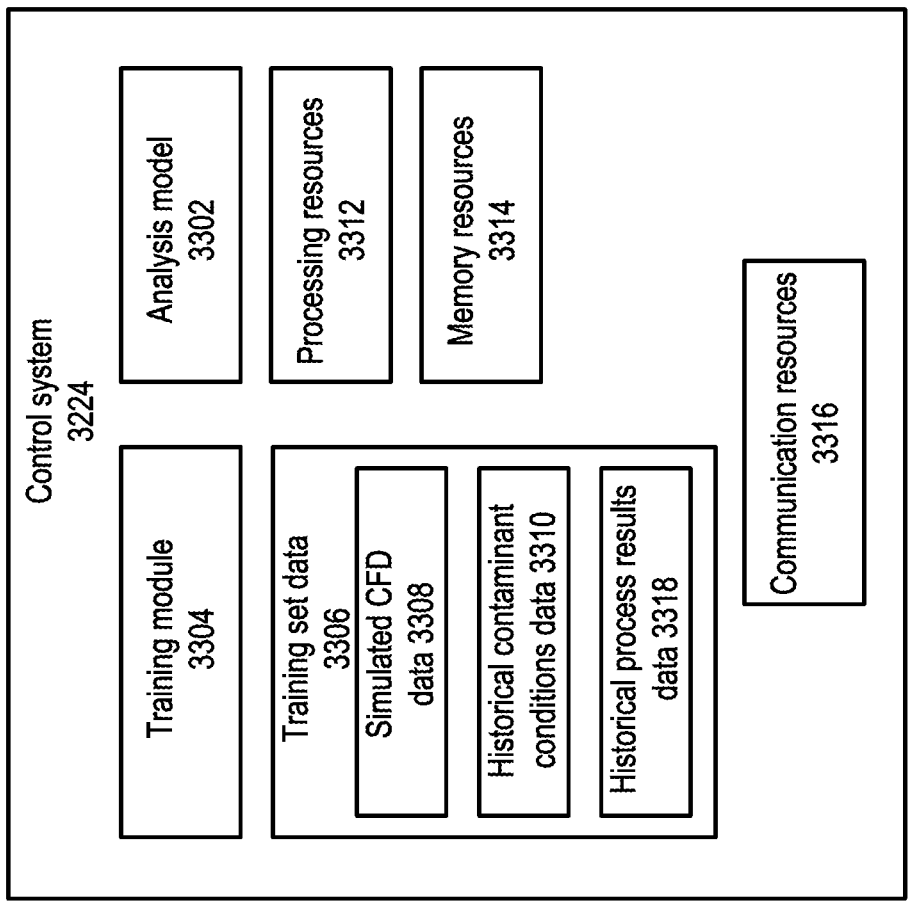
FIGS. 4A-4B are views illustrating a contaminant source prediction process according to various aspects of the present disclosure.
Figure 4B:
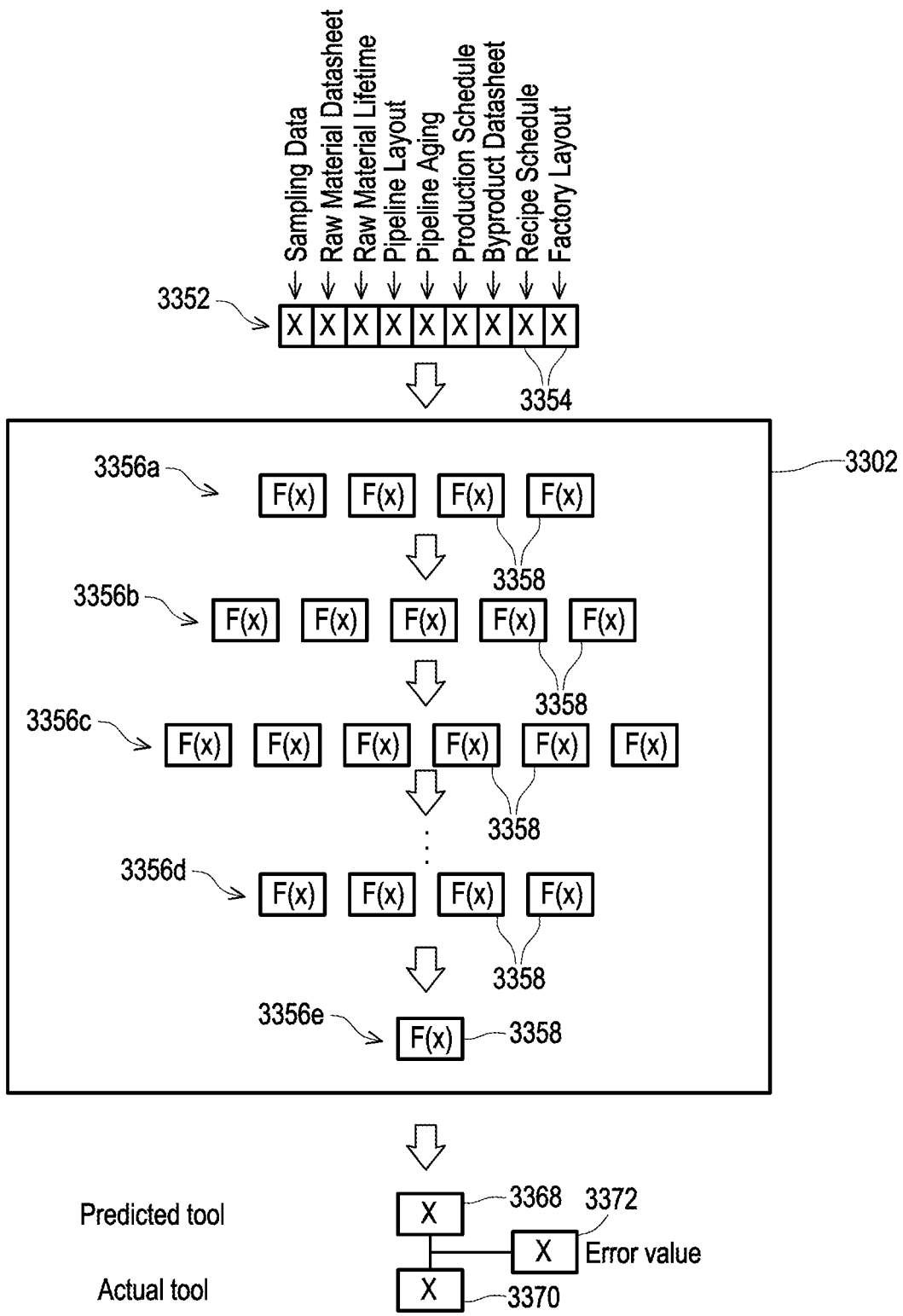

FIGS. 4A, 4B are views illustrating prediction of the fabrication tool 122 causing the peak contaminant level in accordance with various embodiments. FIG. 4A is a block diagram of a system 3224, which may be a control system for performing the operations 200C, 200D of process 20, and/or the operations 320, 321 of the processes 30, 31, respectively. The control system 3224 may forecast environmental quality/safety parameters of the cleanroom 121, and may perform cleanroom environment enhancement based on the forecast parameters. In some embodiments, the control system 3224 utilizes machine learning to predict which fabrication tool 122 is the prime suspect for causing a contaminant leak in the cleanroom 121.

In one embodiment, the control system 3224 includes an analysis model 3302 and a training module 3304. The training module 3304 trains the analysis model 3302 with a machine learning process. The machine learning process trains the analysis model 3302 to select the fabrication tool 122, in some embodiments. Although the training module 3304 is shown as being separate from the analysis model 3302, in practice, the training module 3304 may be part of the analysis model 3302.

The control system 3224 includes, or stores, training set data 3306. The training set data 3306 includes simulated CFD data 3308, historical contaminant conditions data 3310 and historical process results data 3318. The simulated CFD data 3308 includes data related to CFD of the contaminant (s). The historical contaminant conditions data 3310 includes data related to the environment(s) in which the contaminant(s) are measured, such as environmental data associated with the cleanroom 121. The historical process results data 3318 includes data related to wafer quality following fabrication processes by fabrication tools 122 in the cleanroom 121. As will be set forth in more detail below, the training module 3304 utilizes the simulated CFD data 3308, the historical contaminant conditions data 3310 and the historical process results data 3318 to train the analysis model 3302 with a machine learning process.

In one embodiment, the simulated CFD data 3308 includes data related to computational flow dynamics of the contaminant(s) generated by the fabrication tools 122. For example, thousands or millions of calculations of the flow dynamics of the contaminant(s) may be generated by simulating contaminant leakage by the fabrication tools 122 under the influence of environmental conditions of the cleanroom 121. The simulated CFD data 3308 may include the contamination distribution images 210A-210N associated with the fabrication tools 122, which may be simulated individually per contaminant, per environmental condition (e.g., ambient temperature, cleanroom layout, production schedule, chemicals/materials used, and the like), per process step, or other suitable parameter. Accordingly, the simulated CFD data 3308 can include CFD data for a large number of contaminant(s) and operating conditions of the fabrication tools 122.

In one embodiment, the historical contaminant conditions data 3310 include various environmental conditions or parameters during processing of wafers in the cleanroom 121. Accordingly, for each fabrication tool 122 having data in the simulated CFD data 3308, the historical contaminant conditions data 3310 can include the environmental conditions or parameters that were present during processing of wafers. For example, the historical contaminant conditions data 3310 can include data related to the temperature, pH, humidity, light, acclimation time, vibration, ESD, cleanliness, production schedule, and/or other suitable environmental conditions parameters. The historical contaminant conditions data 3310 further includes the distribution maps 240 for each contaminant or TVOC measured by the system 100 during the processing of the wafers.

In one embodiment, the historical process results data 3318 include various wafer quality parameters resulting directly or indirectly from a semiconductor fabrication process performed by the fabrication tools 122 in the cleanroom 121. For example, the semiconductor fabrication processes may include one or more of a photoresist coating process, a planarization process, a cleaning process, a deposition process, an etching process, an annealing process or other suitable fabrication processes. In some embodiments, the historical process results data 3318 may include measurements of various wafer parameters. The measurements may include layer thicknesses, layer uniformity, roughness, cleanness, or other suitable measurements. In some embodiments, the measurements include results of electrical tests, wafer acceptance tests, optical tests or other suitable tests, which may include pass/fail measurements, reliability measurements, data retention measurements or the like. In some embodiments, the historical process results data 3318 are related to a plurality of previously processed semiconductor wafers. In some embodiments, the historical process results data 3318 are related to individual semiconductor wafers, individual runs of semiconductor wafers, and/or individual lots of semiconductor wafers.

In one embodiment, the training set data 3306 links the simulated CFD data 3308 and/or the historical contaminant conditions data 3310 with the historical process results data 3318. In other words, the CFD calculations in the simulated CFD data 3308 and/or the environmental parameters in the environmental conditions data 3310 are linked (e.g., by labeling) to the measurements in the historical process results data 3318. As will be set forth in more detail below, the labeled training set data can be utilized in a machine learning process to train the analysis model 3302 to generate the various forecasts mentioned previously.

In one embodiment, the control system 3324 includes processing resources 3312, memory resources 3314, and communication resources 3316. The processing resources 3312 can include one or more controllers or processors. The processing resources 3312 are configured to execute software instructions, process data, make thin-film etching control decisions, perform signal processing, read data from memory, write data to memory, and to perform other processing operations. The processing resources 3312 can include physical processing resources 3312 and/or virtual processing resources 3312. The processing resources 3312 can include cloud-based processing resources including processors and servers accessed via one or more cloud computing platforms.

In one embodiment, the memory resources 3314 can include one or more computer readable memories. The memory resources 3314 are configured to store software instructions associated with the function of the control system and its components, including, but not limited to, the analysis model 3302. The memory resources 3314 can store data associated with the function of the control system 3224 and its components. The data can include the training set data 3306, current process conditions data, and any other data associated with the operation of the control system 3224 or any of its components. The memory resources 3314 can include physical memory resources and/or virtual memory resources. The memory resources 3314 can include cloud-based memory resources accessed via one or more cloud computing platforms. In some embodiments, the memory resources 3314 include the database 152.

In one embodiment, the communication resources 3316 can include wired and wireless communication resources, which can facilitate communication via one or more networks such as wired networks, wireless networks, the Internet, or an intranet. The communication resources 3316 can enable components of the control system 3224 to communicate with each other.

FIG. 4B is a block diagram illustrating operational aspects and training aspects of the analysis model 3302 of FIG. 4A, according to one embodiment. As described previously, the training set data 3306 includes data related to a plurality of previously processed semiconductor wafers. Each previously processed semiconductor wafer was processed with particular environmental conditions and resulted in a particular processing result. Cleanroom environment sampling data, cleanroom raw material datasheets, cleanroom raw material life time, cleanroom pipeline layout, production schedule, equipment byproduct datasheets, equipment recipe schedule, equipment pipeline aging data, factory layout outside the cleanroom, and daily/weekly/monthly climate forecast, for example, are formatted into a respective conditions matrix 3352. The conditions matrix 3352 includes a plurality of data vectors 3354. Each data vector 3354 corresponds to a particular parameter.

The example of FIG. 4B illustrates a single conditions matrix 3352 that will be passed to the analysis model 3302 during the training process. In the example of FIG. 4B, the conditions matrix 3352 includes nine data vectors 3354, each corresponding to a parameter of the semiconductor fabrication process. For condition types that are not naturally represented in numbers, such as raw material names, a number can be assigned to each possible material.

The analysis model 3302 includes a plurality of neural layers 3356a-e. Each neural layer includes a plurality of nodes 3358. Each node 3358 can also be called a neuron. Each node 3358 from the first neural layer 3356a receives the data values for each data field from the conditions matrix 3352. Accordingly, in the example of FIG. 4B, each node 3358 from the first neural layer 3356a receives 36 data values because the conditions matrix 3352 has 36 data scalars (9*4=36). Each neuron 3358 includes a respective internal mathematical function labeled F(x) in FIG. 3B. Each node 3358 of the first neural layer 3356a generates a scalar value by applying the internal mathematical function F(x) to the data values from the data fields 3354 of the conditions matrix 3352. Further details regarding the internal mathematical functions F(x) are provided below.

Each node 3358 of the second neural layer 3356b receives the scalar values generated by each node 3358 of the first neural layer 3356a. Accordingly, in the example of FIG. 3B each node of the second neural layer 3356b receives four scalar values because there are four nodes 3358 in the first neural layer 3356a. Each node 3358 of the second neural layer 3356b generates a scalar value by applying the respective internal mathematical function F(x) to the scalar values from the first neural layer 3356a.

Each node 3358 of the third neural layer 3356c receives the scalar values generated by each node 3358 of the second neural layer 3356b. Accordingly, in the example of FIG. 3B, each node of the third neural layer 3356c receives five scalar values because there are five nodes 3358 in the second neural layer 3356b. Each node 3358 of the third neural layer 3356c generates a scalar value by applying the respective internal mathematical function F(x) to the scalar values from the nodes 3358 of the second neural layer 3356b.

Each node 3358 of the neural layer 3356d receives the scalar values generated by each node 3358 of the previous neural layer (not shown). Each node 3358 of the neural layer 3356d generates a scalar value by applying the respective internal mathematical function F(x) to the scalar values from the nodes 3358 of the second neural layer 3356b.

The final neural layer includes only a single node 3358. The final neural layer receives the scalar values generated by each node 3358 of the previous neural layer 3356d. The node 3358 of the final neural layer 3356e generates a data value 3368 by applying a mathematical function F(x) to the scalar values received from the nodes 3358 of the neural layer 3356d.

In the example of FIG. 4B, the data value 3368 corresponds to the predicted fabrication tool 122 corresponding to values included in the conditions matrix 3352. The predicted fabrication tool 122 may be represented as a confidence level (e.g., a percentage) in the data value 3368. In some embodiments, the final neural layer 3356e may generate data values corresponding to the various forecasts described above. The final neural layer 3356e will include a respective node 3358 for each output data value to be generated.

During the machine learning process, the analysis model compares the predicted fabrication tool 122 in the data value 3368 to the actual fabrication tool 122 that is the source of the contaminant leak, as indicated by the data value 3370. As set forth previously, the training set data 3306 includes, for each set of historical environmental conditions data, historic process results data indicating the characteristics of the semiconductor wafer that resulted from the fabricating process. Accordingly, the data field 3370 includes the actual contaminant levels present during the fabricating process reflected in the conditions matrix 3352. The analysis model 3302 compares the predicted fabrication tool 122 from the data value 3368 to the actual fabrication tool 122 from the data value 3370. The analysis model 3302 generates an error value 3372 indicating the error or difference between the predicted fabrication tool 122 from the data value 3368 and the actual fabrication tool 122 from the data value 3370. The error value 3372 is utilized to train the analysis model 3302. In some embodiments, the error value 3372 is a difference in confidence levels (e.g., percentages).

The training of the analysis model 3302 can be more fully understood by discussing the internal mathematical functions F(x). While all of the nodes 3358 are labeled with an internal mathematical function F(x), the mathematical function F(x) of each node is unique. In one example, each internal mathematical function has the following form:

$$F(x) = x1*w1 + x2*w2 + \ldots xn*w1 + b.$$

In the equation above, each value x1-xn corresponds to a data value received from a node 3358 in the previous neural layer, or, in the case of the first neural layer 3356a, each value x1-xn corresponds to a respective data value from the data fields 3354 of the reflector conditions matrix 3352. Accordingly, n for a given node is equal to the number of nodes in the previous neural layer. The values w1-wn are scalar weighting values associated with a corresponding node from the previous layer. The analysis model 3302 selects the values of the weighting values w1-wn. The constant b is a scalar biasing value and may also be multiplied by a weighting value. The value generated by a node 3358 is based on the weighting values w1-wn. Accordingly, each node 3358 has n weighting values w1-wn. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions.

After the error value 3372 has been calculated, the analysis model 3302 adjusts the weighting values w1-wn for the various nodes 3358 of the various neural layers 3356a-3356e. After the analysis model 3302 adjusts the weighting values w1-wn, the analysis model 3302 again provides the reflector conditions matrix 3352 to the input neural layer 3356a. Because the weighting values are different for the various nodes 3358 of the analysis model 3302, the predicted reflectivity 3368 will be different than in the previous iteration. The analysis model 3302 again generates an error value 3372 by comparing the actual fabrication tool 3370 to the predicted fabrication tool 3368.

The analysis model 3302 again adjusts the weighting values w1-wn associated with the various nodes 3358. The analysis model 3302 again processes the conditions matrix 3352 and generates a predicted expiration 3368 and associated error value 3372. The training process includes adjusting the weighting values w1-wn in iterations until the error value 3372 is minimized.

FIG. 4B illustrates a single conditions matrix 3352 being passed to the analysis model 3302. In practice, the training process includes passing a large number of conditions matrices 3352 through the analysis model 3302, generating a predicted fabrication tool 3368 for each conditions matrix 3352, and generating associated error value 3372 for each predicted fabrication tool. The training process can also include generating an aggregated error value indicating the average error for all the predicted fabrication tools 122 for a batch of conditions matrices 3352. The analysis model 3302 adjusts the weighting values w1-wn after processing each batch of conditions matrices 3352. The training process continues until the average error across all conditions matrices 3352 is less than a selected threshold tolerance. When the average error is less than the selected threshold tolerance, the analysis model 3302 training is complete and the analysis model is trained to accurately predict the fabrication tool 122 that is the source of a contaminant leak based on the environmental conditions and/or process conditions. The analysis model 3302 can then be used to predict leaks and to select environmental and/or process conditions that will result in reduction of leaks or early containment of leaks (e.g., by dispatching and activating the AGV 123). During use of the trained model 3302, an environmental conditions vector or matrix, representing current environmental conditions for the cleanroom 121 and/or the fabrication tools 122, and having similar format as the conditions matrix 3352, is provided to the trained analysis model 3302. The trained analysis model 3302 can then predict a leak that will result from those environmental conditions.

A particular example of a neural network based analysis model 3302 has been described in relation to FIG. 4B. However, other types of neural network based analysis models, or analysis models of types other than neural networks can be utilized without departing from the scope of the present disclosure. Furthermore, the neural network can have different numbers of neural layers having different numbers of nodes without departing from the scope of the present disclosure.

Embodiments may provide advantages. Faster response time (within 1 minute) is possible by utilizing the local TOF-MS 142, allowing for earlier and faster response upon prediction or detection of a CxF, IPA/acetone and/or TVOC leakage event manifests. AMC influence on manufacturing may be reduced to a minimum. Monitoring of AMC situations is performed in quasi-real-time, including for the global cleanroom environment and for fabrication tools or accessories per process zone, with areas deviating from baseline, OOC or OOS highlighted. Alarms may be sent to manufacturing operators and factory operators for further action, such as maintenance or repair. Measured data is compared to an image database by an AI-based graphical recognition program, and advanced AMC data comparison verifies selection of the fabrication tool identified as the source of a contaminant leak. An AI-based management program automatically judges and dispatches AMC cleaners carrying a fan and filter to move toward the AMC event area for treatment.

In accordance with at least one embodiment, a method comprises: generating a contaminant distribution map by sampling an environment of a cleanroom; selecting a first fabrication tool of the cleanroom by comparing the contaminant distribution map with at least one diffusion image in a first database; comparing parameters of the first fabrication tool against process utility information in a second database; and when the parameters are consistent with the process utility information, taking at least one action. The one action may include moving a cleaning tool to a location associated with a contaminant concentration of the contaminant distribution map; turning on a fan of the cleaning tool; stopping pod transit to the first fabrication tool; or halting production by the first fabrication tool.

In accordance with at least one embodiment, a method comprises: generating cleanroom contaminants data by sampling cleanroom contaminants by a sampling system; generating a first image based on the cleanroom contaminants data by a time-of-flight mass spectrometer (TOF-MS); selecting a first fabrication tool based on a forecast using the first image and at least one other cleanroom diffusion image; and reducing contaminant concentration near the first fabrication tool by an automated guided vehicle (AGV) dispatched by an AGV controller.

In accordance with at least one embodiment, a method comprises: positioning a wafer in a fabrication tool; detecting a peak concentration level of a contaminant above a first threshold; predicting the fabrication tool as a source of the contaminant; stopping delivery of further wafers to the fabrication tool; completing processing of the wafer by the fabrication tool; removing the wafer from the fabrication tool; lowering the peak concentration level by repairing the fabrication tool; and resuming delivery of the further wafers to the fabrication tool when the fabrication tool is repaired and the peak concentration level is below a baseline threshold lower than the first threshold.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   generating a contaminant distribution map by sampling an environment of a cleanroom;
   selecting a first fabrication tool of the cleanroom by comparing the contaminant distribution map with at least one diffusion image in a first database;
   comparing parameters of the first fabrication tool against process utility information in a second database; and
   when the parameters are consistent with the process utility information, taking at least one action of:
   moving a cleaning tool to a location associated with a contaminant concentration of the contaminant distribution map;
   turning on a fan of the cleaning tool;
   stopping pod transit to the first fabrication tool; or
   halting production by the first fabrication tool.

2. The method of claim 1, wherein selecting the first fabrication tool comprises:
   selecting a first diffusion image of the at least one diffusion image; and selecting the first fabrication tool when a confidence level of the first fabrication tool is a highest confidence level of all fabrication tools associated with the first diffusion image.

3. The method of claim 2, wherein the confidence level is determined based on at least one computational fluid dynamics simulation.

4. The method of claim 3, wherein the confidence level is forecasted by a trained machine learning analysis model.

5. The method of claim 1, wherein:
moving the cleaning tool to the location is performed when a peak concentration level of the contaminant distribution map is above a first threshold; and
turning on the fan is performed when the peak concentration level is above a second threshold higher than the first threshold.

6. The method of claim 5, wherein:
stopping pod transit and halting production are performed when the peak concentration level is above a third threshold higher than the second threshold.

7. The method of claim 1, wherein selecting the first fabrication tool includes selecting a tool accessory located beneath a raised floor of the cleanroom.

8. A method, comprising:
generating cleanroom contaminants data by sampling cleanroom contaminants by a sampling system;
generating a first image based on the cleanroom contaminants data by a time-of-flight mass spectrometer (TOF-MS);
selecting a first fabrication tool based on a forecast using the first image and at least one other cleanroom diffusion image; and
reducing contaminant concentration near the first fabrication tool by an automated guided vehicle (AGV) dispatched by an AGV controller.

9. The method of claim 8, wherein sampling the cleanroom contaminants includes sampling at least one of chlorofluorocarbons, hydrofluorocarbons, perfluorocarbons, isopropyl alcohol, acetone or total volatile organic compounds (TVOC).

10. The method of claim 8, wherein sampling the cleanroom contaminants includes sampling by the sampling system including sampling units at an areal density in a range of about 1 per square meter ($m^2$) to about 50 per $m^2$.

11. The method of claim 10, wherein areal density of the sampling units is higher in a first zone of the cleanroom than in a second zone of the cleanroom.

12. The method of claim 11, wherein the first zone includes an etching apparatus or an electroless copper plating apparatus.

13. The method of claim 8, further comprising verifying the first fabrication tool by confirming:
acid or solvent supply send from the first fabrication tool;
operational status of the first fabrication tool;
utility information of the first fabrication tool; or
chemical use information of the first fabrication tool.

14. A method, comprising:
positioning a wafer in a fabrication tool;
detecting a peak concentration level of a contaminant above a first threshold;
predicting the fabrication tool as a source of the contaminant;
stopping delivery of further wafers to the fabrication tool;
completing processing of the wafer by the fabrication tool;
removing the wafer from the fabrication tool;
lowering the peak concentration level by repairing the fabrication tool; and
resuming delivery of the further wafers to the fabrication tool when the fabrication tool is repaired and the peak concentration level is below a baseline threshold lower than the first threshold.

15. The method of claim 14, further comprising dispatching a cleaning tool to the fabrication tool when the peak concentration level exceeds a second threshold between the first threshold and the baseline threshold.

16. The method of claim 15, further comprising filtering air near the fabrication tool when the peak concentration level exceeds a third threshold between the second threshold and the first threshold.

17. The method of claim 16, further comprising recalling the cleaning tool when the peak concentration level exceeds the first threshold.

18. The method of claim 16, wherein filtering the air includes turning on a fan of the cleaning tool in fluidic communication with a filter of the cleaning tool.

19. The method of claim 18, wherein filtering the air includes orienting the filter toward a location associated with the peak concentration level by a drive system of the cleaning tool.

20. The method of claim 15, wherein dispatching the cleaning tool includes transmitting a dispatch command wirelessly from an automated guided vehicle (AGV) controller to an AGV having a filtration system.

* * * * *